United States Patent
Yamada et al.

(10) Patent No.: US 11,762,247 B2
(45) Date of Patent: Sep. 19, 2023

(54) DISPLAY DEVICE

(71) Applicant: SHARP KABUSHIKI KAISHA, Sakai (JP)

(72) Inventors: Junichi Yamada, Sakai (JP); Makoto Yokoyama, Sakai (JP); Naoki Ueda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 592 days.

(21) Appl. No.: 16/981,447

(22) PCT Filed: Mar. 16, 2018

(86) PCT No.: PCT/JP2018/010431
§ 371 (c)(1),
(2) Date: Sep. 16, 2020

(87) PCT Pub. No.: WO2019/176085
PCT Pub. Date: Sep. 19, 2019

(65) Prior Publication Data
US 2021/0048699 A1    Feb. 18, 2021

(51) Int. Cl.
*G02F 1/1345* (2006.01)
*H05K 1/18* (2006.01)
*H10K 59/12* (2023.01)

(52) U.S. Cl.
CPC ......... *G02F 1/13452* (2013.01); *H05K 1/189* (2013.01); *H10K 59/12* (2023.02)

(58) Field of Classification Search
CPC .... G02F 1/13452; G02F 2201/56; G09F 9/00; G09F 9/30; H05K 1/189; H10K 59/12; H10K 59/131
See application file for complete search history.

(56) References Cited

U.S. PATENT DOCUMENTS

| | | | | |
|---|---|---|---|---|
| 7,908,628 B2* | 3/2011 | Swart | ................. | H04N 21/6377 725/135 |
| 8,484,676 B1* | 7/2013 | Narsimhan | ........ | H04N 21/4126 725/23 |
| 2002/0162120 A1* | 10/2002 | Mitchell | ............ | H04N 21/8586 725/135 |

(Continued)

FOREIGN PATENT DOCUMENTS

| | | |
|---|---|---|
| JP | 2009-134246 A | 6/2009 |
| JP | 2016-148843 A | 8/2016 |

(Continued)

*Primary Examiner* — Michael B. Pierorazio
(74) *Attorney, Agent, or Firm* — ScienBiziP, P.C.

(57) ABSTRACT

Provided is a display device including a display panel which allows a curvature portion thereof to be narrowed near a terminal portion even when circuit blocks are arranged in the curvature portion.
For a data line in the form of a polyline consisting of a plurality of short straight line segments in a first curvature portion 12a of a display panel 10, as the distance from a terminal portion 16 increases, the slant angle of each straight line segment increases, the number of data lines d decreases, and hence the width of a data line area decreases. Accordingly, the number of unit circuit blocks 70 in a parallel circuit block 80 disposed in a circuit area can be increased by widening the circuit area in proportion to the decrease in the width of the data line area.

14 Claims, 24 Drawing Sheets

(56) References Cited

U.S. PATENT DOCUMENTS

| | | | |
|---|---|---|---|
| 2003/0229900 A1* | 12/2003 | Reisman | H04N 21/4755 348/E7.071 |
| 2005/0028195 A1* | 2/2005 | Feinleib | H04N 7/163 725/135 |
| 2008/0155622 A1* | 6/2008 | Chami | H04N 21/235 348/E7.071 |
| 2009/0102758 A1* | 4/2009 | Anzai | G09G 3/3225 345/76 |
| 2010/0037258 A1* | 2/2010 | Chitturi | H04N 21/234318 725/39 |
| 2010/0299702 A1* | 11/2010 | Lo | H04L 67/55 725/39 |
| 2011/0302611 A1* | 12/2011 | Eyer | H04N 21/4345 725/39 |
| 2011/0307920 A1* | 12/2011 | Blanchard | H04N 21/26241 725/32 |
| 2012/0047531 A1* | 2/2012 | Eyer | H04N 21/8547 725/37 |
| 2012/0324504 A1* | 12/2012 | Archer | H04N 21/2743 725/30 |
| 2013/0074141 A1* | 3/2013 | Hwang | H04N 21/242 725/116 |
| 2013/0347026 A1* | 12/2013 | Reisman | G06F 16/21 725/25 |
| 2013/0347038 A1* | 12/2013 | Lee | H04N 21/4622 725/40 |
| 2014/0068686 A1* | 3/2014 | Oh | H04N 21/4532 725/93 |
| 2015/0293546 A1* | 10/2015 | Tanaka | G02F 1/13454 327/541 |
| 2016/0240141 A1* | 8/2016 | Lee | G02F 1/13454 |
| 2016/0247478 A1* | 8/2016 | Ishige | G02F 1/1345 |
| 2017/0221434 A1* | 8/2017 | Shima | G09G 3/3611 |
| 2021/0027716 A1* | 1/2021 | Yamada | G09G 3/3266 |

FOREIGN PATENT DOCUMENTS

| | | |
|---|---|---|
| JP | 2017-134339 A | 8/2017 |
| WO | 2014/069529 A1 | 5/2014 |

\* cited by examiner

FIG. 23
(a)
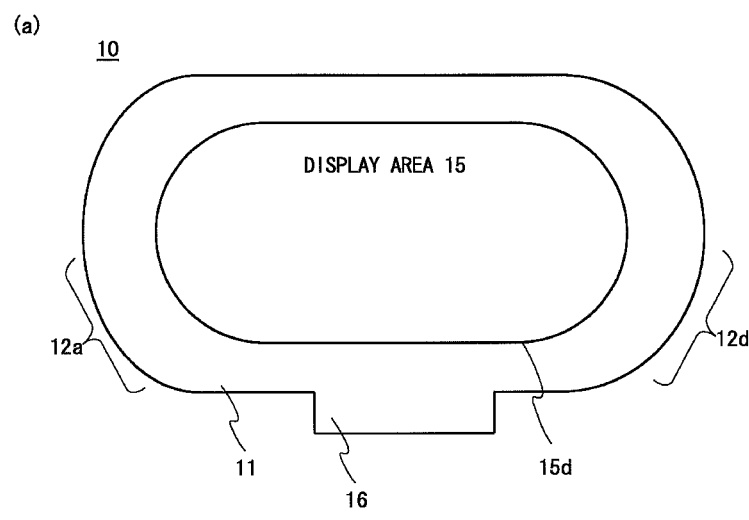
(b)
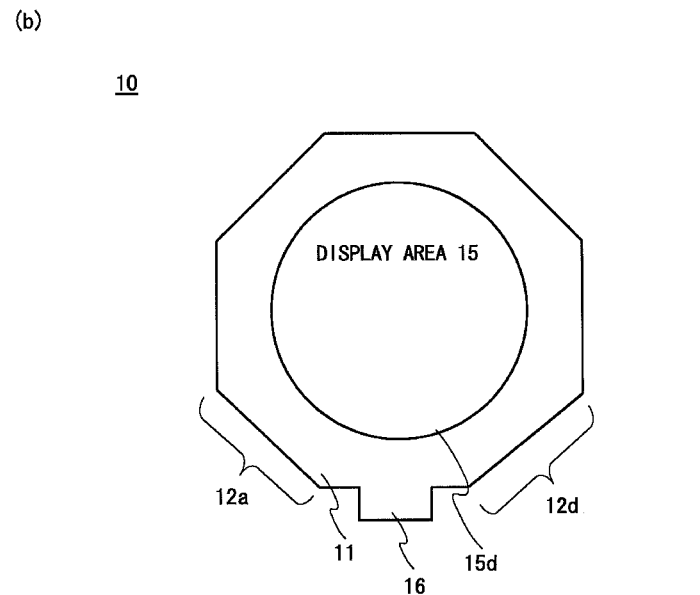

FIG. 24
(a)
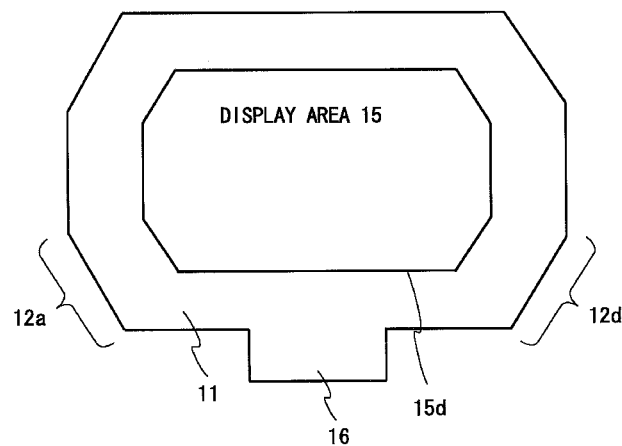
(b)
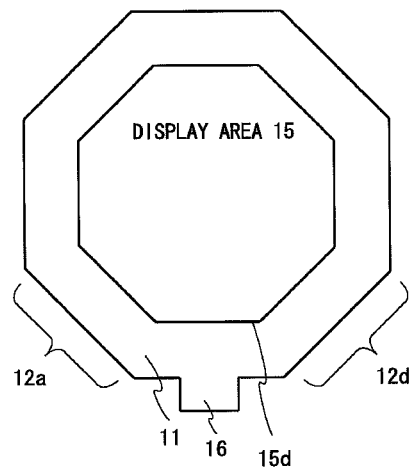

DISPLAY DEVICE

TECHNICAL FIELD

The following disclosure relates to display devices, more specifically to a display device, such as an organic EL display device, which includes electro-optic elements driven by current.

BACKGROUND ART

As a thin display device that achieves high picture quality, low power consumption, etc., an organic EL (electro-luminescent) display device is drawing attention and currently under active development. In the organic EL display device, a display panel on which to display an image includes a display area, in which a plurality of pixel circuits are arranged, and a frame area provided around the display area, in which a monolithic driver circuit is disposed as a driver circuit for driving the pixel circuits.

In recent years, with proliferation of mobile electronic devices, display panels (irregularly shaped panels) shaped differently from conventional rectangular panels have been increasingly used in order to achieve more compact electronic devices. In some cases, as an irregularly shaped panel of this sort, a panel with smooth arc-like corners is used. To dispose a driver circuit in a frame area of an irregularly shaped panel, there is a conventionally known technique of disposing a driver circuit in a narrow straight frame area.

However, in the case of the irregularly shaped panel, it is often required to dispose a driver circuit not only in a straight frame area but also in a curved frame area, and this demands narrowing the curved frame area. In particular, in the case of a curved frame area near a terminal portion, it is required to ensure an area for routing data lines that supply data signals to the pixel circuits formed in the display area, resulting in an increased frame width.

Patent Document 1 discloses that when arranging a plurality of driver circuits in a curved frame area of an irregularly shaped panel, unit circuit blocks that consist of unit circuits of one type and constitute a scanning line driver circuit are arranged along an outer edge of a display area, with the unit circuits deviating from one another in the same direction as a direction in which scanning lines extend, thereby narrowing the curved frame area.

CITATION LIST

Patent Document

Patent Document 1: Japanese Laid-Open Patent Publication No. 2009-134246

SUMMARY OF THE INVENTION

Problems to be Solved by the Invention

Arranging the unit circuit blocks by the method disclosed in Patent Document 1 allows for narrowing curved frame areas away from the terminal portion of the irregularly shaped panel. However, there is a problem in that it is necessary to ensure a data line routing area in the curved frame area that is close to the terminal portion, resulting in an increased frame width.

Therefore, an objective of the present disclosure is to provide a display device including a display panel which allows a curvature portion thereof to be narrowed near a terminal portion even when circuit blocks are arranged in the curvature portion.

Solution to the Problems

A first aspect is directed to a display device including a display panel provided with a display area, a frame area provided around the display area, and a terminal portion, the display area having arranged therein a plurality of scanning lines, a plurality of emission control lines extending parallel to the scanning lines, a plurality of data lines extending so as to cross the scanning lines and the emission control lines, and a plurality of pixel circuits provided near respective intersections of the scanning lines and the data lines, the frame area having disposed therein a circuit block including at least one of a plurality of scan circuits configured to respectively output scanning signals to the scanning lines and at least one of a plurality of emission circuits configured to respectively output emission control signals to the emission control lines, the terminal portion being provided with lines for externally supplying data signals to the data lines, wherein the display panel has a curved area or a slanted area included at least in a curvature portion near the terminal portion, the curvature portion has formed therein a data line area and a circuit area, the data line area having some of the data lines arranged so as to extend from the terminal portion along an outer edge of the display area, the circuit area having at least one of the circuit blocks disposed outside the data line area, the data line area decreases in width away from the terminal portion, and the circuit area increases in width away from the terminal portion.

Effect of the Invention

In the first aspect, the display panel has an irregularly shaped area in which the data line area and the circuit area are formed; in the data line area, some of the data lines are arranged along the outer edge of the display area, and in the circuit area, the circuit blocks, including the scan circuits and the emission circuits, are formed. As the distance from the terminal portion increases, the data lines increase in slant angle but decrease in number, and therefore the data line area decreases in width. The circuit area can be widened in proportion to the decrease in the width of the data line area, and therefore the number of unit circuit blocks in the circuit block disposed in the circuit area can be increased. Accordingly, even when the data line area is provided in the curvature portion near the terminal portion in order to route the data lines, the curvature portion can be prevented from becoming wide. Thus, the frame area of the display panel can be narrowed.

BRIEF DESCRIPTION OF THE DRAWINGS

FIG. 23 provides diagrams illustrating examples of the shapes of the display panel and the display area to which the arrangement of the circuit blocks described in the first through third embodiments can be applied.

FIG. 24 provides diagrams illustrating other examples of the shapes of the display panel and the display area to which the arrangement of the circuit blocks described in the first through third embodiments can be applied.

MODES FOR CARRYING OUT THE INVENTION

1. First Embodiment 1.1 Configuration of the Organic E1 Display Device

Figure 1:
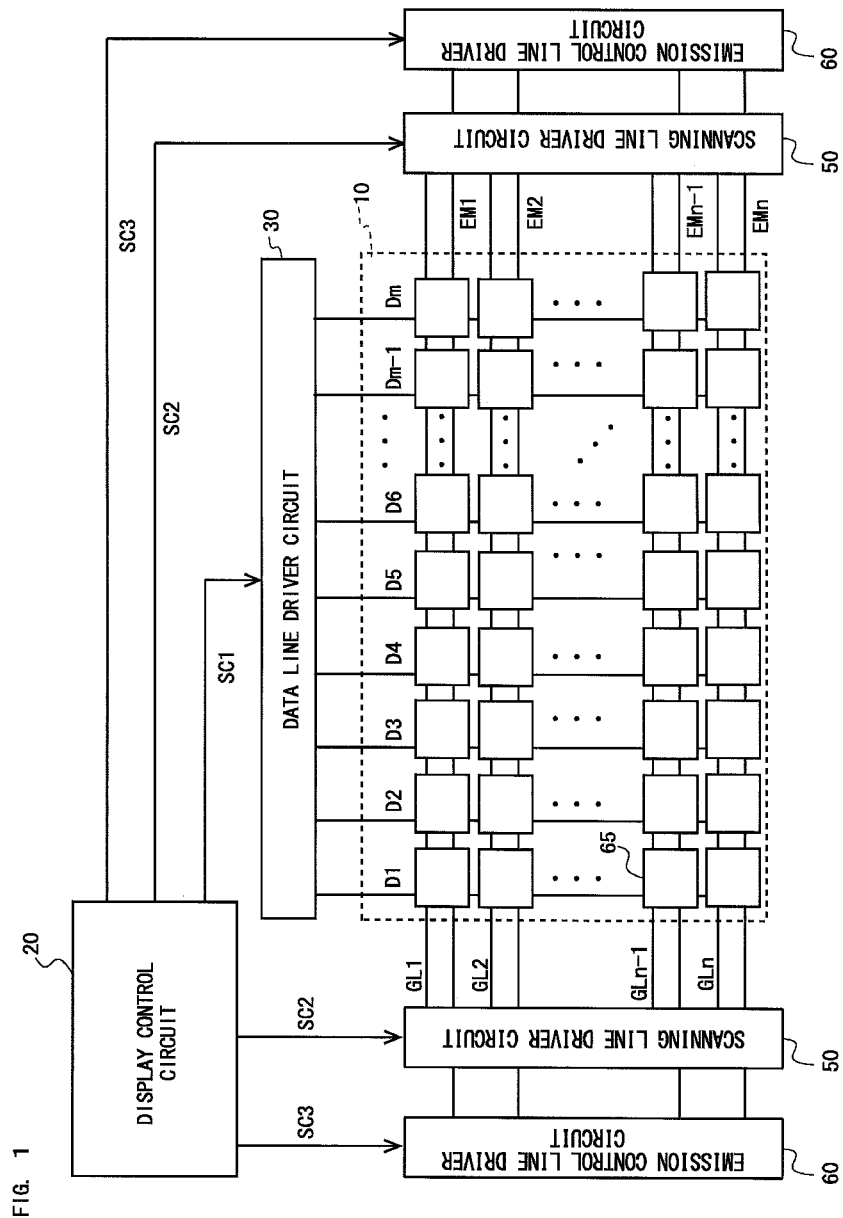
FIG. 1 is a block diagram illustrating the configuration of an organic EL display device according to a first embodiment.

FIG. 1 is a block diagram illustrating the configuration of an organic EL display device according to a first embodiment. As shown in FIG. 1, the organic EL display device (referred to below simply as the "display device") includes a display panel 10, a display control circuit 20, a data line driver circuit 30, scanning line driver circuits 50, and emission control line driver circuits 60. The numbers of scanning line driver circuits 50 and emission control line driver circuits 60 are both two, and these circuits are arranged one each on either side of the display panel 10.

The display panel 10 has m (where m is an integer of 1 or more) data lines D1 to Dm arranged thereon. These data lines D1 to Dm cross n scanning lines GL1 to GLn extending between the scanning line driver circuits 50. Moreover, the n scanning lines GL1 to GLn are parallel to n emission control lines EM1 to EMn extending between the emission control line driver circuits 60. There are pixel circuits 65 provided in the vicinity of respective intersections of the data lines and the scanning lines. The pixel circuits 65 emit light in accordance with data signals supplied through the data lines, thereby displaying an image on the display panel 10.

The data line driver circuit 30 generates and supplies a data signal for one horizontal line per horizontal period to each of the data lines D1 to Dm in accordance with data DA and a control signal SC1, both of which are provided by the display control circuit 20. The scanning line driver circuit 50 sequentially generates and supplies scanning signals to the scanning lines GL1 to GLn in accordance with a control signal SC2 provided by the display control circuit 20. As a result, the pixel circuits 65 that are connected to the scanning lines provided with the scanning signals are sequentially selected. The emission control line driver circuit 60 generates and supplies emission control signals to the emission control lines EM1 to EMn connected to the pixel circuits 65, in accordance with a control signal SC3 provided by the display control circuit 20. The scanning line driver circuit 50 is constituted by n scanning circuits for respectively driving the scanning lines GL1 to GLn, and the emission control line driver circuit 60 is constituted by n emission circuits for respectively driving the emission control lines EM1 to EMn. These circuits are formed as gate driver monolithic (GDM) circuits in a frame area of the display panel 10.

When each data line is provided with a data signal, whereby a low-level scanning signal is provided to a scanning line, pixel circuits connected to the scanning line are selected, and the data signal is written to the pixel circuits through the data line. At this time, the pixel circuits 65 are provided with a control signal SC3 from the emission control line driver circuit 60 via an emission control line. As a result, a drive current corresponding to the data signal flows through organic EL display elements (electro-optic elements) provided in the pixel circuits 65, so that the organic EL display elements emit light. This allows the pixel circuits 65 to emit light in gradations corresponding to the data signal, thereby displaying an image on the display panel 10.

It should be noted that in the case where the number of output terminals of the data line driver circuit 30 is reduced, demultiplexer portions may be provided between the data line driver circuit 30 and the pixel forming portions so as to drive the display device by a drive method called SSD (source-shared driving) in which the data line driver circuit 30 supplies data signals to the data lines via the demultiplexer portions.

1.2 Shape of the Display Panel

Figure 2:
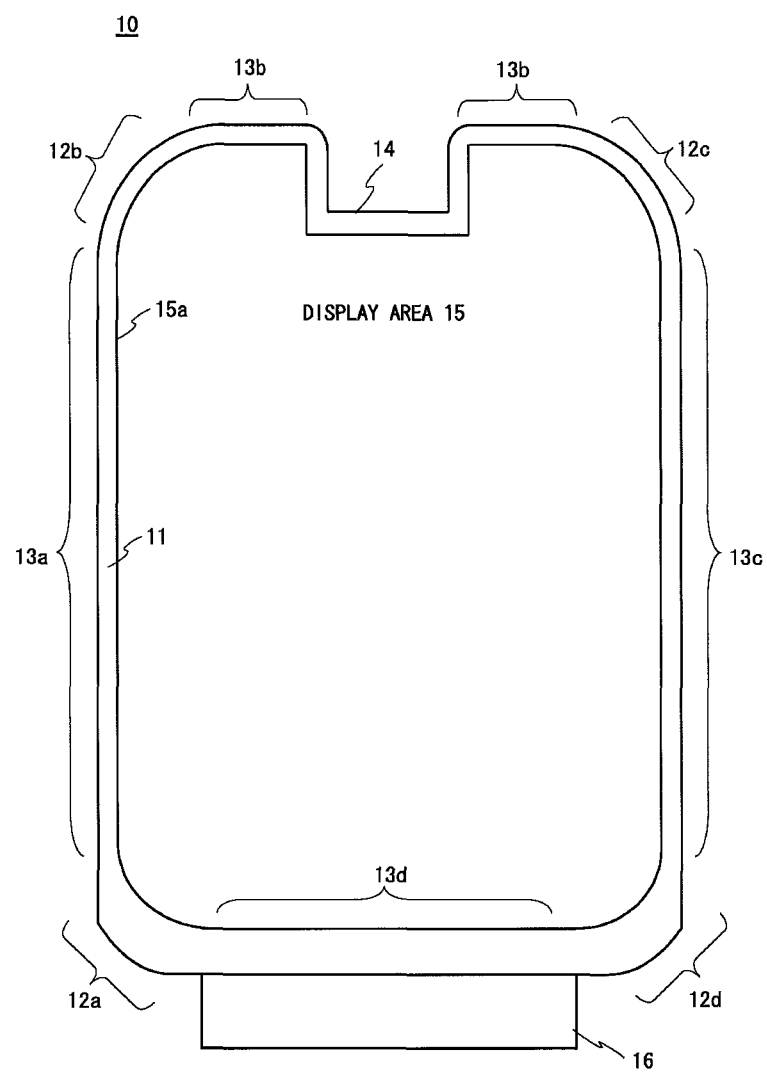
FIG. 2 is a diagram illustrating an irregularly shaped display panel included in the display device in the first embodiment.

FIG. 2 is a diagram illustrating the display panel 10 in an irregular shape included in the display device of the present embodiment. As shown in FIG. 2, the display panel (irregularly shaped panel) 10 includes a frame area 11 and a display area 15, and the frame area 11 consists of curvature portions and side portions; the curvature portions are arc-like curved portions in four respective corners, and the side portions are straight areas extending between the curvature portions 12 along top, bottom, left, and right edges of the display panel 10. The four curvature portions will be respectively referred to as the first curvature portion 12a, the second curvature portion 12b, the third curvature portion 12c, and the fourth curvature portion 12d, and the four side portions will be respectively referred to as the first side portion 13a, the second side portion 13b, the third side portion 13c, and the fourth side portion 13d.

The display panel 10 has a notch (cutout) 14 provided at the top so as to facilitate incorporation of a lens or suchlike, and the display panel 10 also has a rectangular terminal portion 16 provided at the bottom, where the data lines for externally supply data signals are formed. The second curvature portion 12b of the display panel 10, which is located away from the terminal portion 16, has approximately the same width as the first side portion 13a. However, the first curvature portion 12a located near the terminal portion 16 is used as an area (data line area) for routing the data lines, and therefore tends to be wide, which renders it difficult to achieve a narrowed frame area. Accordingly, the scanning circuits and the emission circuits are arranged in a manner contrived to not widen the first curvature portion.

Figure 3:
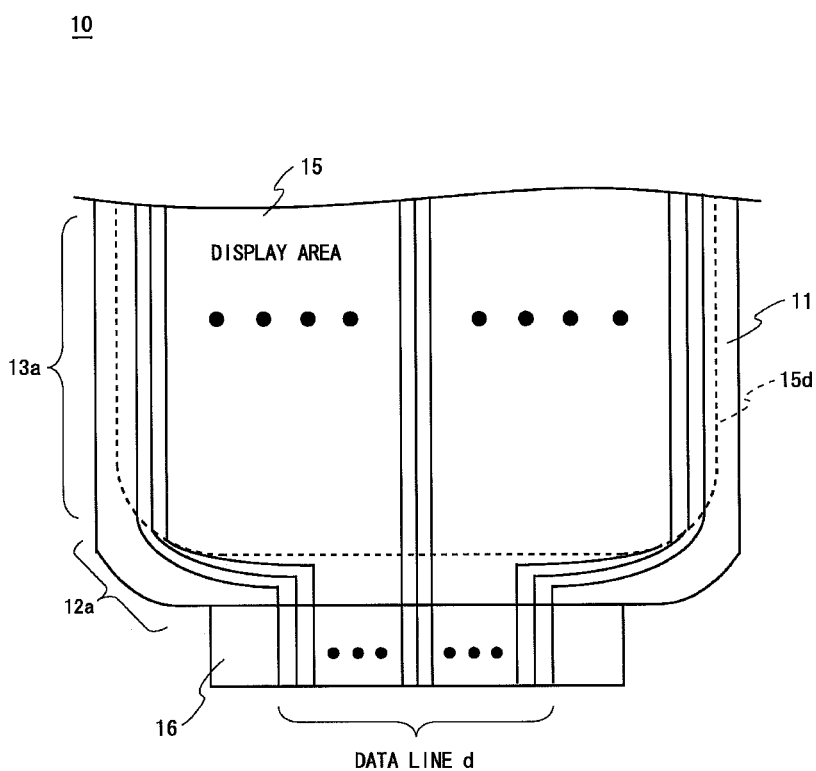
FIG. 3 is a diagram illustrating a lower portion of the display panel shown in FIG. 2.

FIG. 3 is a diagram illustrating a lower portion of the display panel 10 shown in FIG. 2. As shown in FIG. 3, the terminal portion 16 is provided at the bottom of the display panel 10 and has a flexible circuit board (not shown) bonded thereto by thermal compression, with 2 m data lines d formed thereon and extending from the demultiplexer portions. The data lines d that are formed through the middle of the terminal portion 16 extend straight into the display area 15 in order to supply data signals to the pixel circuits that are formed in and around the middle of the display area 15, whereas the data lines d that are formed on opposite sides of the terminal portion 16 extend along an outer edge 15d of the display area 15 and are connected at the first curvature portion 12a to data lines in the display area in order to supply data signals to the pixel circuits that are arranged on opposite sides of the display area 15.

1.3 Scan Circuit

Figure 4:
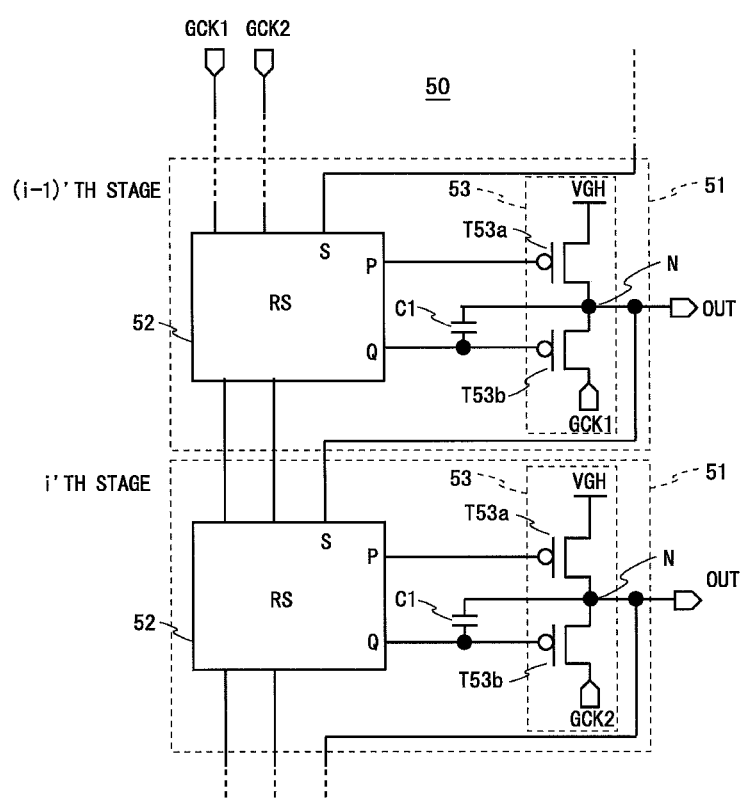
FIG. 4 is a block diagram illustrating the configuration of scan circuits included in the display device according to the first embodiment.

FIG. 4 is a block diagram illustrating the configuration of scan circuits 51 included in the display device according to the present embodiment. The scanning line driver circuit 50 consists of n scan circuits 51 connected in multiple stages. In FIG. 4, only the (i−1)'th (where i is an integer such that 2≤i≤n) and the i'th of the scan circuits 51 are shown. Signals inputted or outputted via specific terminals will be referred to below by the same names as the terminals. For example, a signal inputted via a clock terminal GCK1 will be referred to as a clock signal GCK1.

Each of the i'th and (i−1)'th scan circuits 51 includes a known RS flip-flop circuit 52, and an output control circuit 53 connected to the RS flip-flop circuit 52. The RS flip-flop circuit 52 is provided with clock terminals GCK1 and GCK2, an input terminal S, and output terminals P and Q. The output control circuit 53 is a circuit configured by two P-channel transistors T53a and T53b connected in series, and the transistor T53a has a gate terminal connected to the output terminal P of the RS flip-flop circuit 52, and a source terminal connected to a high-level power line VGH. The transistor T53b has a gate terminal connected to the output terminal P of the RS flip-flop circuit 52, and a source terminal connected to a drain terminal of the transistor T53a.

Furthermore, there is a capacitor C1 provided between the output terminal Q and a node N at which the drain terminal of the transistor T53a and the source terminal of the transistor T53b are connected. There is an output terminal OUT extending from the node N and connected to a corresponding scanning line and an input terminal S in the next stage. Note that the drain terminal of the transistor T53b in the (i−1)'th stage is connected to the clock terminal GCK1, and the drain terminal of the transistor T53b in the i'th stage is connected to the clock terminal GCK2.

Figure 5:
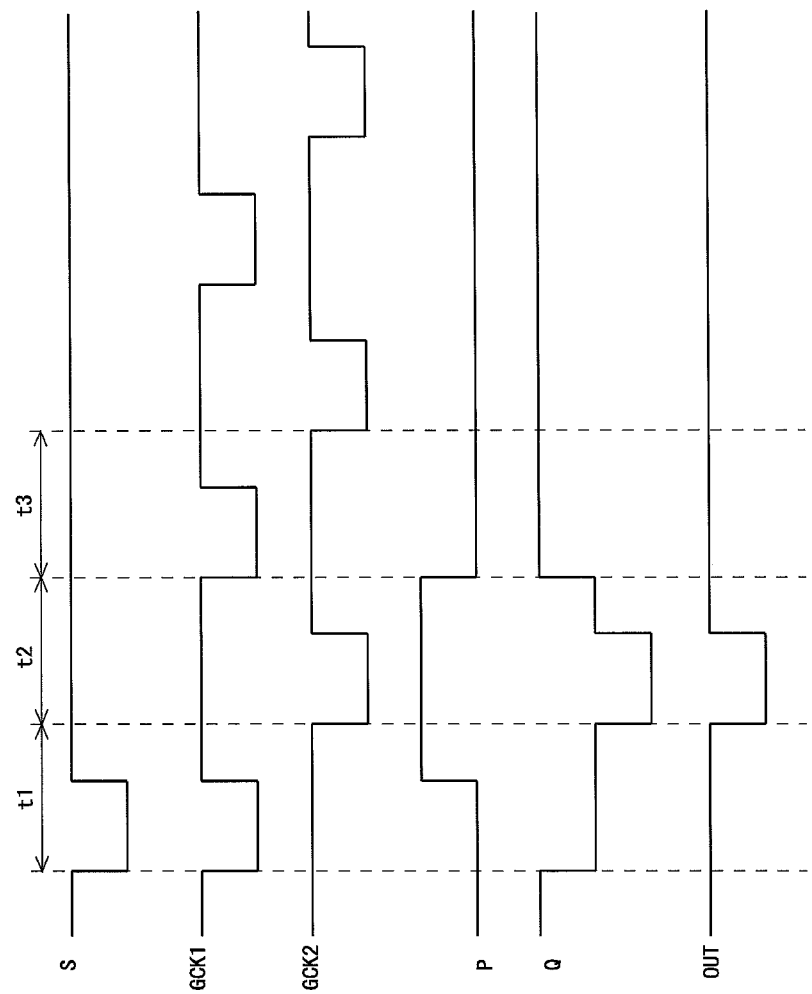
FIG. 5 is a timing chart for the scan circuit shown in FIG. 4.

FIG. 5 is a timing chart for the scan circuit 51 shown in FIG. 4. As shown in FIG. 5, during the first part of period t1, the RS flip-flop circuit 52 is supplied with a low-level input signal S from the output terminal OUT of the scan circuit 51 in the preceding stage, the clock terminals GCK1 and GCK2 are respectively supplied with a low-level clock signal GCK1 and a high-level clock signal GCK2, and then the RS flip-flop circuit 52 outputs a low-level output signal P and an output signal Q. The output signal P is supplied to the gate terminal of the transistor T53a, and the output signal Q is supplied to the gate terminal of the transistor T53b. As a result, the transistor T53a is rendered in ON state, and the transistor T53b is rendered in OFF state, so that the output control circuit 53 outputs a high-level output signal OUT.

During the second part of period t1, the RS flip-flop circuit 52 is supplied with a high-level input signal S from the scan circuit 51 in the preceding stage, the clock terminals GCK1 and GCK2 are respectively supplied with a high-level clock signal GCK1 and a clock signal GCK2, and then the RS flip-flop circuit 52 outputs a high-level output signal P and a low-level output signal Q. As a result, the transistor T53a is rendered in OFF state, and the transistor T53b is rendered in ON state, so that the output control circuit 53 outputs a high-level output signal OUT.

During the first part of period t2, the RS flip-flop circuit 52 is supplied with a high-level input signal S from the scan circuit 51 in the preceding stage, the clock terminals GCK1 and GCK2 are respectively supplied with a high-level clock signal GCK1 and a low-level clock signal GCK2, and then the RS flip-flop circuit 52 outputs a high-level output signal P and a low-level output signal Q. As a result, the transistor T53a is rendered in OFF state, and the transistor T53b is rendered in ON state, so that the output control circuit 53 outputs a low-level output signal OUT. Consequently, the scanning line that is connected to the output terminal OUT of the scan circuit 51 is selected, whereby the pixel circuits that are connected to the scanning line are selected. Accordingly, the pixel circuits have data signals written through the data lines. Note that the capacitor C1 functions as a bootstrap capacitor, and therefore the voltage that is applied to the gate terminal of the transistor T53b is lower than the voltage of the output signal Q. Thus, the transistor T53b can output a low-level clock signal GCK2 without changing the voltage level.

During the second part of period t2, the RS flip-flop circuit 52 is supplied with a high-level input signal S from the scan circuit 51 in the preceding stage, the clock terminals GCK1 and GCK2 are respectively supplied with high-level clock signals GCK1 and GCK2, and then the RS flip-flop circuit 52 outputs a high-level output signal P and a low-level output signal Q. As a result, the transistor T53a is rendered in OFF state, and the transistor T53b is rendered in ON state, so that the output control circuit 53 outputs a high-level output signal OUT.

During the first part of period t3, the RS flip-flop circuit 52 is supplied with a high-level input signal S from the scan circuit 51 in the preceding stage, the clock terminals GCK1 and GCK2 are respectively supplied with a low-level clock signal GCK1 and a high-level clock signal GCK2, and then the RS flip-flop circuit 52 outputs a low-level output signal P and a high-level output signal Q. As a result, the transistor T53a is rendered in ON state, and the transistor T53b is rendered in OFF state, so that the output control circuit 53 outputs a high-level output signal OUT.

Similarly, during the second part of period t3, the transistor T53a is rendered in ON state, and the transistor T53b is rendered in OFF state, with the result that the output control circuit 53 outputs a high-level output signal OUT. During the following periods, high-level output signals OUT are similarly outputted. In this manner, when the high-level output signal OUT is outputted, the pixel circuits that are connected to the scanning line that corresponds to the output terminal OUT are not selected, and therefore, no data signal is written to the pixel circuits.

1.4 Emission Circuit

Figure 6:
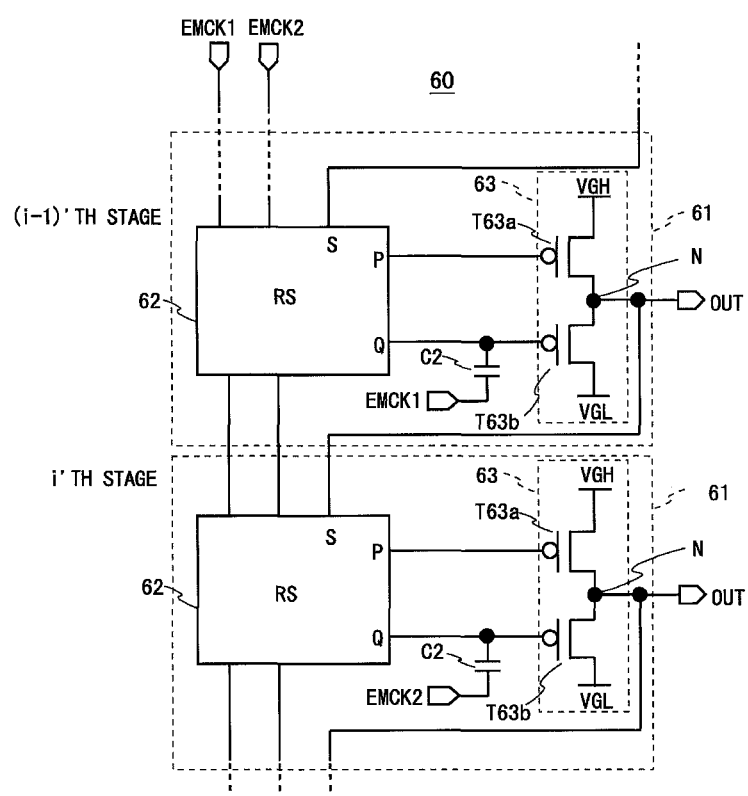
FIG. 6 is a block diagram illustrating the configuration of an emission circuit included in the display device according to the first embodiment.

The emission circuit will be described next. FIG. 6 is a block diagram illustrating the configuration of the emission circuit 61 included in the display device according to the present embodiment. The emission control line driver circuit 60 consists of n emission circuits 61 connected in multiple stages, and FIG. 6 shows the (i-1)'th and the i'th of the emission circuits 61.

The configuration of the emission circuit 61 shown in FIG. 6 is similar to the configuration of the scan circuit 51 shown in FIG. 4, and therefore differences will be mainly described. As shown in FIG. 6, the emission circuit 61 also includes a known RS flip-flop circuit 62, and an output control circuit 63 connected to the RS flip-flop circuit 62. The RS flip-flop circuit 62 is provided with clock terminals EMCK1 and EMCK2. The output control circuit 63 consists of two transistors T63a and T63b with drain terminals connected to a low-level power line VGL, and the transistor T63b has a gate terminal connected to one end of a capacitor C2. Accordingly, the output control circuit 63 can stably output a low-level output signal OUT. Moreover, the capacitor C2 in the (i-1)'th stage is connected at the other end to the clock terminal EMCK1, and the capacitor C2 in the i'th stage is connected at the other end to the clock terminal EMCK2.

Figure 7:
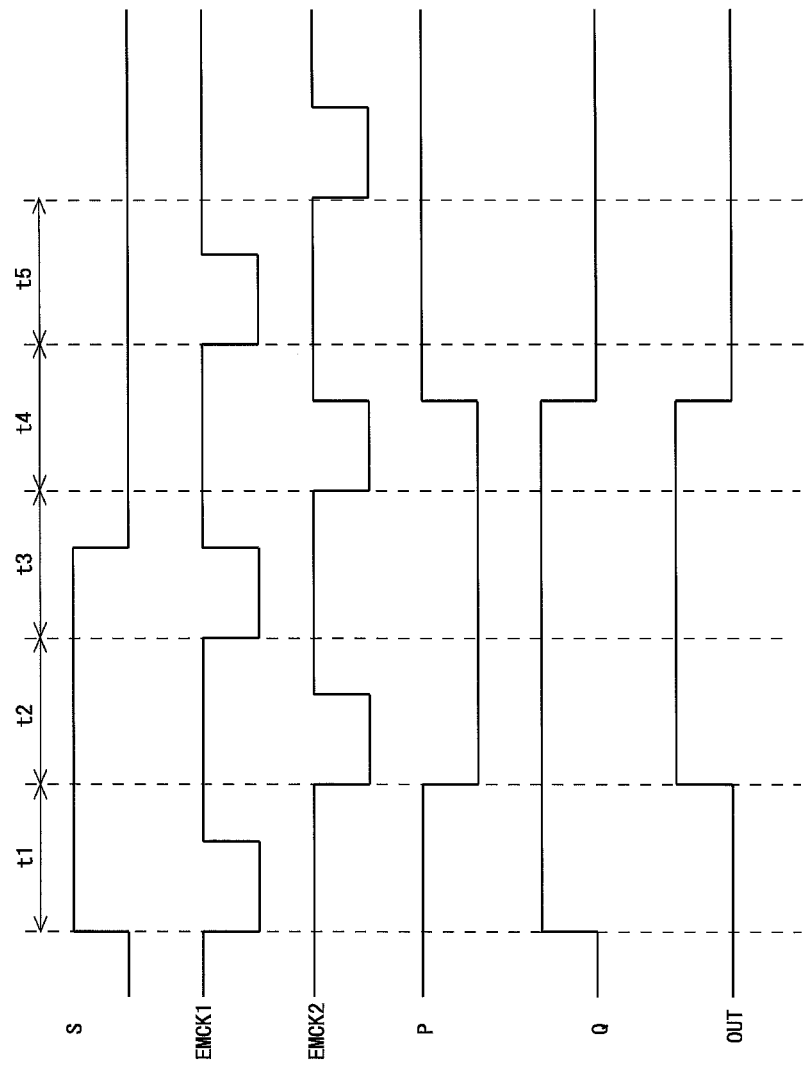
FIG. 7 is a timing chart for the emission circuit shown in FIG. 6.

FIG. 7 is a timing chart for the emission circuit 61 shown in FIG. 6. As shown in FIG. 7, during the first part of period t1, the RS flip-flop circuit 62 is supplied with a high-level input signal S from the emission circuit 61 in the preceding stage, the clock terminals EMCK1 and EMCK2 are respectively supplied with a low-level clock signal EMCK1 and a high-level clock signal EMCK2. The RS flip-flop circuit 62 outputs a high-level output signal P and a low-level output signal Q. The output signal P is supplied to the gate terminal of the transistor T63a, and the output signal Q is supplied to the gate terminal of the transistor T63b. As a result, the transistor T63a is rendered in OFF state, and the transistor T63b is rendered in ON state, so that the output control circuit 63 outputs a low-level output signal OUT.

During the second part of period t1, the RS flip-flop circuit 62 is supplied with a high-level input signal S, the clock terminals EMCK1 and EMCK2 are respectively supplied with high-level clock signals EMCK1 and EMCK2, and then the RS flip-flop circuit 62 outputs a high-level output signal P and a low-level output signal Q. As a result, the transistor T63a is rendered in OFF state, and the transistor T63b is rendered in ON state, so that the output control circuit 63 outputs a low-level output signal OUT.

During the first part of period t2, the RS flip-flop circuit 62 is supplied with a high-level input signal S, the clock terminals EMCK1 and EMCK2 are respectively supplied with a high-level clock signal EMCK1 and a low-level clock signal EMCK2, and then the RS flip-flop circuit 62 outputs a low-level output signal P and a high-level output signal Q. As a result, the transistor T63a is rendered in ON state, and the transistor T63b is rendered in OFF state, so that the output control circuit 63 outputs a high-level output signal OUT.

During the second part of period t2, the RS flip-flop circuit 62 is supplied with a high-level input signal S, the clock terminals EMCK1 and EMCK2 are respectively supplied with high-level clock signals EMCK1 and EMCK2, and then a low-level output signal P and a high-level output signal Q are outputted. As a result, the transistor T63a is rendered in ON state, and the transistor T63b is rendered in OFF state, so that the output control circuit 63 outputs a high-level output signal OUT.

During the first part of period t3, the RS flip-flop circuit 62 is supplied with a high-level input signal S, a low-level clock signal EMCK1 and a high-level clock signal EMCK2 are supplied, and then the RS flip-flop circuit 62 outputs a low-level output signal P and a high-level output signal Q. As a result, the transistor T63a is rendered in ON state, and the transistor T63b is rendered in OFF state, so that the output control circuit 63 outputs a high-level output signal OUT.

During the second part of period t3 and the first part of period t4, similar to during the second part of period t2, a high-level output signal OUT is outputted, and during the first part of period t4, similar to during the first part of period t2, a high-level output signal OUT is outputted. During the first part of period t5, similar to during the first part of period t1, a low-level output signal OUT is outputted, and during the second part of period t5, similar to the second part of period t1, a low-level output signal OUT is outputted. Thereafter, similarly, once a low-level output signal OUT is outputted, a corresponding emission control line is selected, transistors (not shown) connected to organic EL display elements in pixel circuits are rendered in ON state. As a result, during periods following period t5, the organic EL display elements have a drive current flowing therethrough and therefore emit light.

Figure 8:
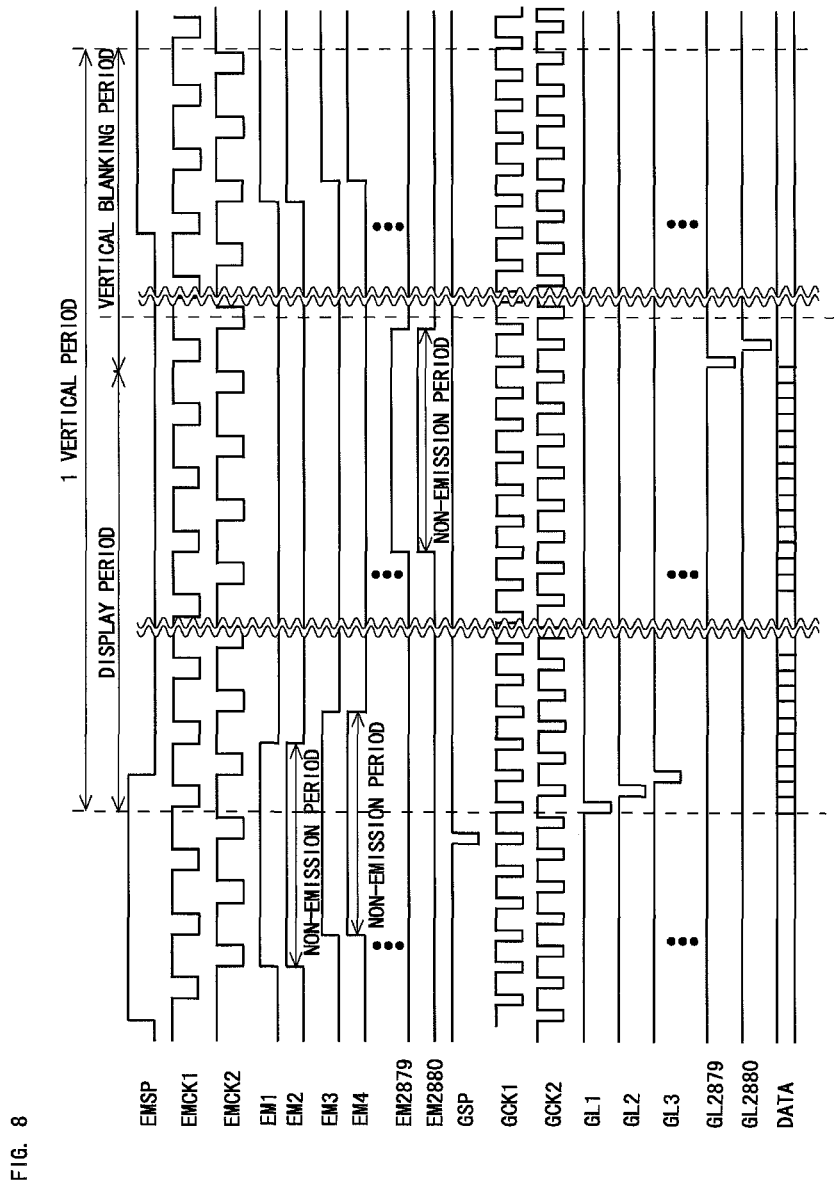
FIG. 8 is a timing chart illustrating the operation of the display device shown in FIG. 1.

FIG. 8 is a timing chart illustrating the operation of the display device in the present embodiment. As shown in FIG. 8, one vertical period includes a display period and a vertical blanking period subsequent thereto. The lower part of the timing chart shows times at which the scanning lines GL1 to GLn are sequentially set to a low potential level in accordance with clock signals GCK1 and GCK2. At the time when a scanning line is set low, a data line corresponding thereto is supplied with a data signal, with the result that the data signal is written through the data line to the pixel circuits that are connected to the scanning line supplied with a low-level scanning signal. In this manner, the data signal is written sequentially to the pixel circuits connected to the scanning lines. Note that the relationship between the clock signals GCK1 and GCK2 and the output signal of the scan circuit 51 is the same as that described in conjunction with the timing chart shown in FIG. 5 and therefore will not be elaborated upon.

The upper part of the timing chart shows times at which the emission control lines EM1 to EMn are sequentially set to a high potential level in accordance with clock signals EMCK1 and EMCK2. In this case, prior to the low-level scanning signal being supplied to the scanning line, the emission control line is supplied with a high-level emission control signal, so that no drive current flows through the organic EL display elements of the pixel circuits. Accordingly, this period serves as a non-emission period.

Thereafter, once the data signal is written to the pixel circuits, the emission control line is supplied with a low-level emission control signal. As a result, the organic EL display elements have a current flowing therethrough in accordance with the data signal and emit light in gradations corresponding to the data signal. Subsequently, the emission control line is maintained at the low potential level until the blanking period, so that the organic EL display elements continue to emit light until the vertical blanking period. Note that the emission control lines are changed from a high to a low potential level in pairs, and therefore the pixel circuits sequentially emit light group by group, each group being connected to two emission control lines, and the emission continues until the vertical blanking period. Note that the relationship between the clock signals EMCK1 and EMCK2 and the output signal of the emission circuit is the same as that described in conjunction with the timing chart shown in FIG. 7 and therefore will not be elaborated upon.

1.5 Arrangement of the Scan Circuit and the Emission Circuit

1.5.1 Arrangement in Comparative Example

Figure 9:
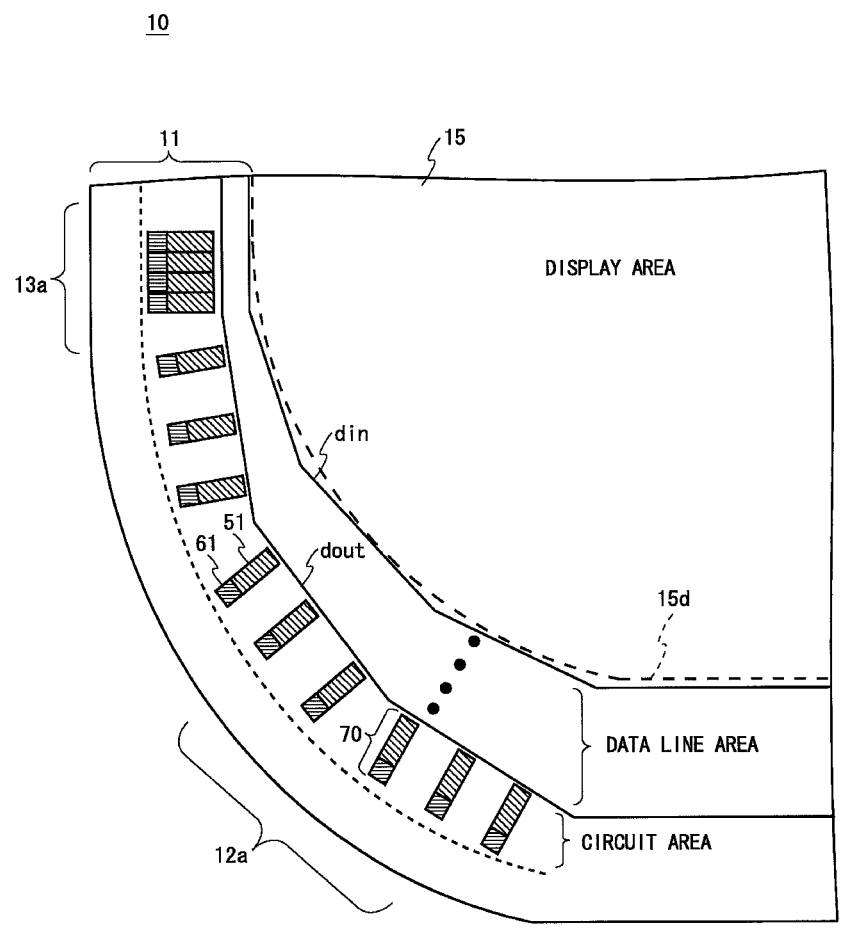
FIG. 9 is an enlarged view of a first curvature portion and a surrounding portion of a display panel in a comparative example of the first embodiment.

FIG. 9 is an enlarged view of a first curvature portion 12a and a surrounding portion of a display panel 10 in a comparative example of the present embodiment. In the comparative example shown in FIG. 9, the display panel 10 in an irregular shape includes unit circuit blocks 70, each consisting of one scan circuit 51 and one emission circuit 61 connected in series, and the unit circuit blocks 70 are radially arranged in the first curvature portion 12a and a first side portion 13a, such that the scan circuits 51 face an outer edge 15d. In this case, it is necessary to provide the first curvature portion 12a with a routing area (data line area) for data lines d extending from a terminal portion 16, and therefore it is difficult to narrow the first curvature portion 12a to approximately the same width as the first side portion 13a.

1.5.2 Arrangement in the Present Embodiment

Figure 10:
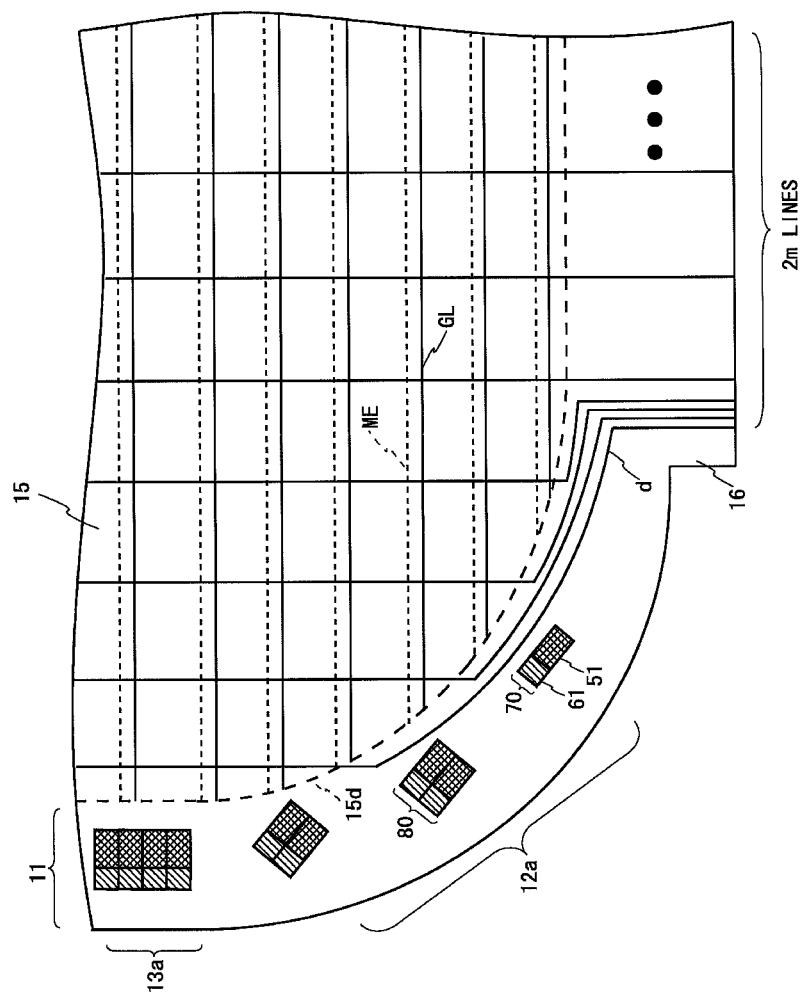
FIG. 10 is an enlarged view of a first curvature portion and a surrounding portion of the display panel in the first embodiment.

FIG. 10 is an enlarged view of the first curvature portion 12a and a surrounding portion of the display panel 10 in the present embodiment. As shown in FIG. 10, the display area 15 has n scanning lines GL and n emission control lines ME formed horizontally in FIG. 10, and there are 2 m data lines formed so as to cross theses lines. The frame area 11 has n scan circuits 51 and n emission circuits 61 arranged therein. Although omitted in FIG. 10, the scan circuits 51 are respectively connected to the n scanning lines through which scanning signals are supplied. The emission circuits 61 are respectively connected to the n emission control lines through which emission control signals are supplied.

Furthermore, some of the m data lines D that extend from the terminal portion 16 provide data signals to pixel circuits (not shown) arranged near the first side portion 13a of the display area 15, and such lines d extend along the outer edge 15d of the display area 15 and are connected to the data lines D that are formed in the display area 15, at points near the outer edge 15d and the pixel circuits to which the data signals are to be provided. Accordingly, the data line area needs to be provided in the first curvature portion 12a near the terminal portion 16. However, the number of data lines d arranged in the first curvature portion 12a decreases away from the terminal portion 16, and therefore the width of the data line area gradually decreases away from the terminal portion 16. Note that FIG. 10 only shows some data lines d near the display area 15 and some data lines d away from the display area 15, and data lines arranged therebetween are omitted.

Figure 11:
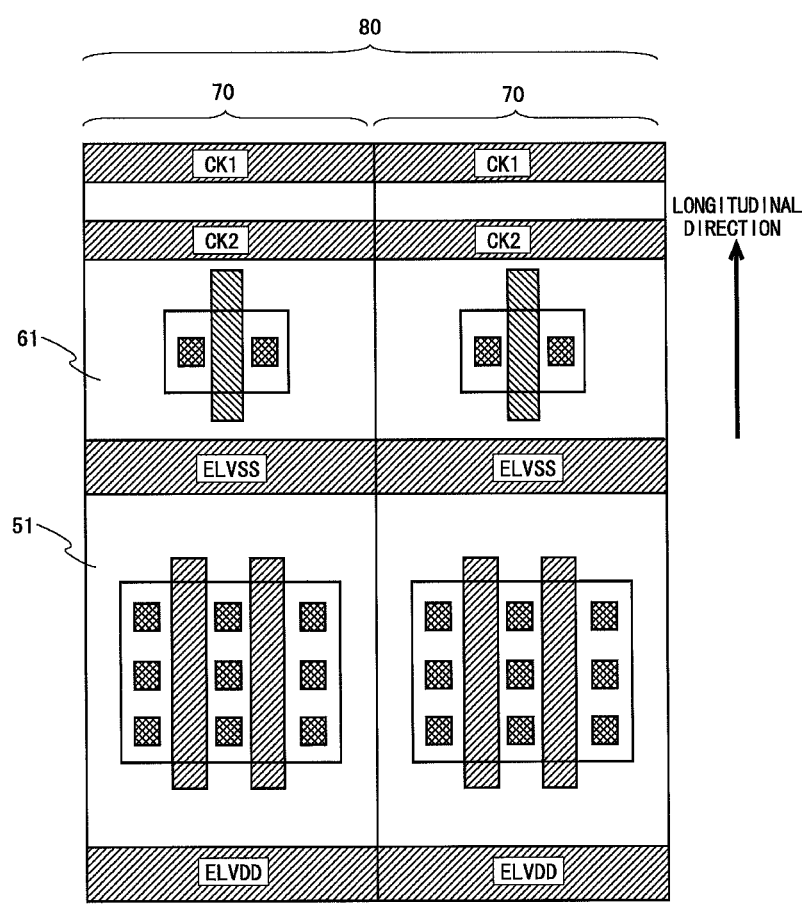
FIG. 11 is a diagram illustrating the configurations of a unit circuit block and a parallel circuit block arranged in the first curvature portion in the first embodiment.
Figure 12:
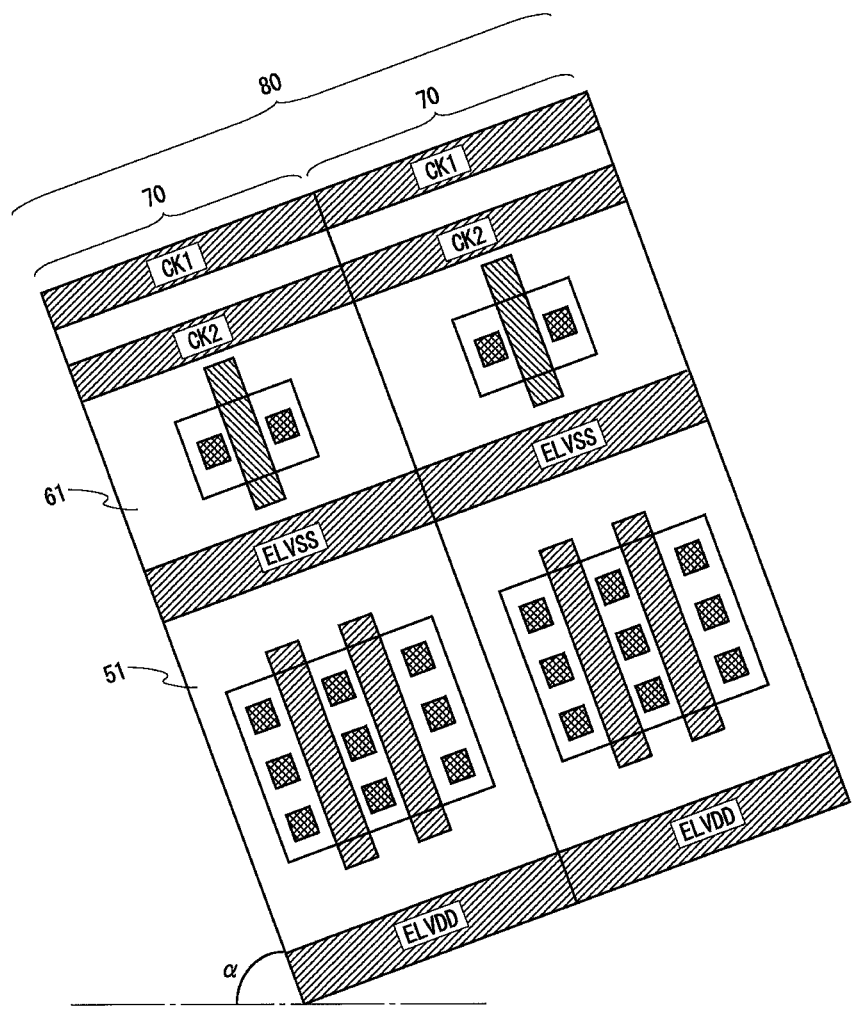
FIG. 12 is a diagram illustrating the unit circuit blocks and the parallel circuit block shown in FIG. 11 where the unit circuit blocks and the parallel circuit block are disposed in a slanted position.

FIG. 11 is a diagram illustrating the configurations of the unit circuit block 70 and the parallel circuit block 80 that are disposed in the first curvature portion 12a, and FIG. 12 is a diagram illustrating the unit circuit blocks 70 and the parallel circuit block 80 shown in FIG. 11 where the unit circuit blocks and the parallel circuit block are disposed in a slanted position. The parallel circuit block 80 shown in FIG. 11 includes two parallel unit circuit blocks, each consisting of one scan circuit 51 and one emission circuit 61 connected in series. Moreover, the parallel circuit block 80 shown in FIG. 12 disposed at a slant angle α from the horizontal direction (i.e., the direction in which the scanning lines and the emission control lines extend). Both the scan circuit 51 and the emission circuit 61 are constituted by a plurality of TFTs (thin-film transistors). Accordingly, to indicate this, FIGS. 11 and 12 only show some of the transistors. Moreover, FIG. 11 shows an arrow indicating the longitudinal direction of the unit circuit block 70 and the parallel circuit block 80. As shown in FIG. 11, the longitudinal direction of the unit circuit block 70 and the parallel circuit block 80 is in the direction in which the scan circuit 51 and the emission circuit 61 are arranged in series. Note that herein, the unit circuit block 70 and the parallel circuit block 80 will also be referred to collectively as the "circuit blocks", and a portion of the frame area 11 where the circuit blocks are arranged will also be referred to as the "circuit area".

Figure 13:
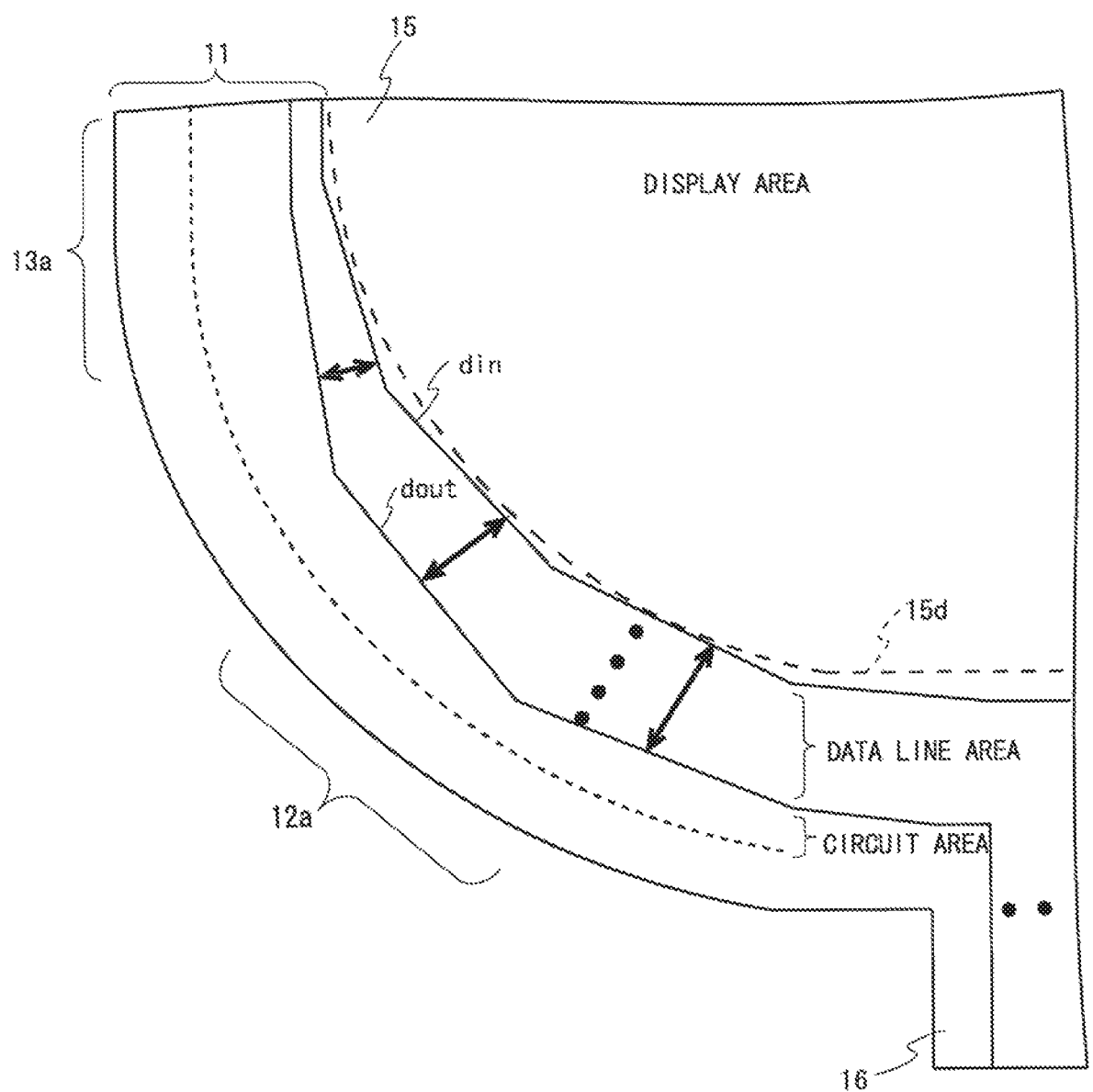
FIG. 13 is a diagram showing the widths of a data line area and a circuit area in the first curvature portion near a terminal portion of the display panel in the first embodiment.

FIG. 13 is a diagram showing the widths of the data line area and the circuit area in the first curvature portion 12a near the terminal portion 16 of the display panel 10. As shown in FIG. 13, the number of data lines d arranged in the frame area 11 decreases away from the terminal portion 16, and therefore the width of the data line area decreases away from the terminal portion 16. Accordingly, the first curvature portion 12a is not widened even when the area (circuit area) where the circuit blocks are arranged increases in width in proportion to the decrease in the width of the data line area, and more preferably, the sum of the widths of the data line area and the circuit area can be kept almost constant regardless of the location in the frame area. As the distance from the terminal portion 16 increases, a parallel circuit block 80 in which more unit circuit blocks 70 are arranged in parallel can be disposed in the circuit area. Moreover, in the case where the parallel circuit block 80 is disposed in the circuit area, more unit circuit blocks 70 can be arranged by slanting the parallel circuit block 80.

Therefore, in the present embodiment, the unit circuit blocks 70 and the parallel circuit blocks 80 are arranged in the first curvature portion 12a in a manner as described below, with a view to ensuring the data line area for routing the data lines d and arranging a necessary number of unit circuit blocks 70 while keeping the sum of the widths of the data line area and the circuit area almost constant.

Figure 14:
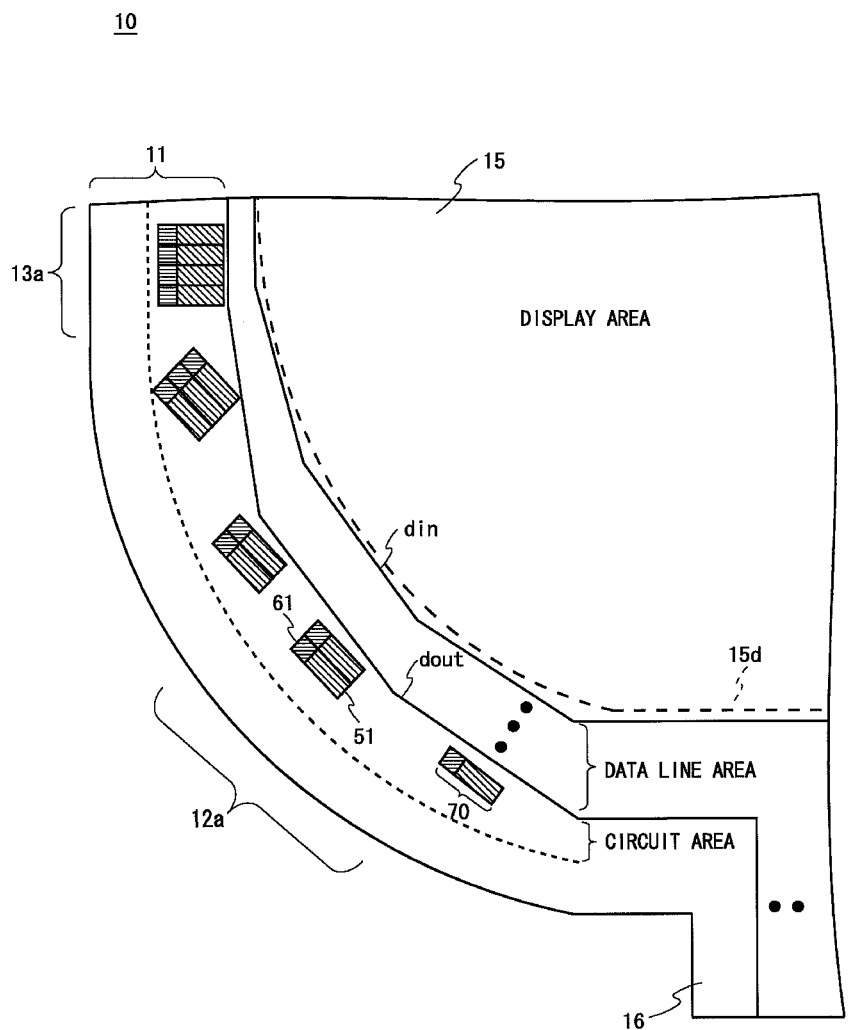
FIG. 14 is an enlarged view of a portion of the display panel in the first embodiment.

FIG. 14 is an enlarged view of a portion of the display panel 10 in the present embodiment. As shown in FIG. 14, in the present embodiment, each data line d arranged in the data line area is in the form of a polyline consisting of a plurality of short straight line segments slanted at greater angles away from the terminal portion 16. Moreover, in the first curvature portion 12a, the unit circuit blocks 70 and the parallel circuit blocks 80 have a constant slant angle of, for example, about 45 degrees regardless of location. The reason for this is that the slant of the data lines d arranged in the first curvature portion 12a sequentially changes from an angle close to 0 degrees to an angle close to 90 degrees as the distance from the terminal portion 16 increases, and the slant angle of the circuit blocks is most preferably about 45 degrees, which is an approximate average angle among the circuit blocks. However, the slant angle is not limited to about 45 degrees and may be an angle within the range from about 30 degrees to about 60 degrees. Note that in the first side portion 13a, each unit circuit block 70 is arranged at a slant angle of 0 degrees.

In this manner, the circuit area is widened in the first curvature portion 12a by increasing the unit circuit blocks 70 included in the parallel circuit block 80 in number away from the terminal portion 16, in proportion to the decrease in the width of the data line area, while ensuring the width of the data line area. Therefore, the scan circuits 51 and the emission circuits 61 that are to be arranged in the first curvature portion 12a can be disposed with the sum of the widths of the data line area and the circuit area kept almost constant in the first curvature portion 12a, so that the first curvature portion 12a can be narrowed more than in the comparative example. Moreover, along with some structures, there are wiring lines formed outside the circuit area within the frame area 11 for the purpose of connecting to cathodes of the organic EL display elements.

It should be noted that FIG. 14 shows the unit circuit blocks 70 arranged in the first side portion 13a and the first curvature portion 12a of the display panel 10, but the unit circuit blocks 70 may also be arranged in a third side portion (not shown) and a fourth curvature portion (not shown), which are opposed to the first side portion 13a with respect to the display area 15. Moreover, the unit circuit block 70 described in the present embodiment has the scan circuits 51 and the emission circuits 61 situated respectively near and far from the outer edge 15d of the display area 15, but the unit circuit block may have the scan circuits 51 and the emission circuits 61 situated respectively far from and near the outer edge 15d.

Described next are the definitions of the terms "width of the circuit area" and "width of the data line area" as used herein. In the case where each data line d is in the form of a polyline consisting of a plurality of straight line segments, as shown in FIG. 13, each circuit block is arranged at a certain angle (e.g., 45 degrees) to the horizontal direction along the outermost data line dout. Calculation of the width of the circuit area in such a case will be described.

Figure 15:
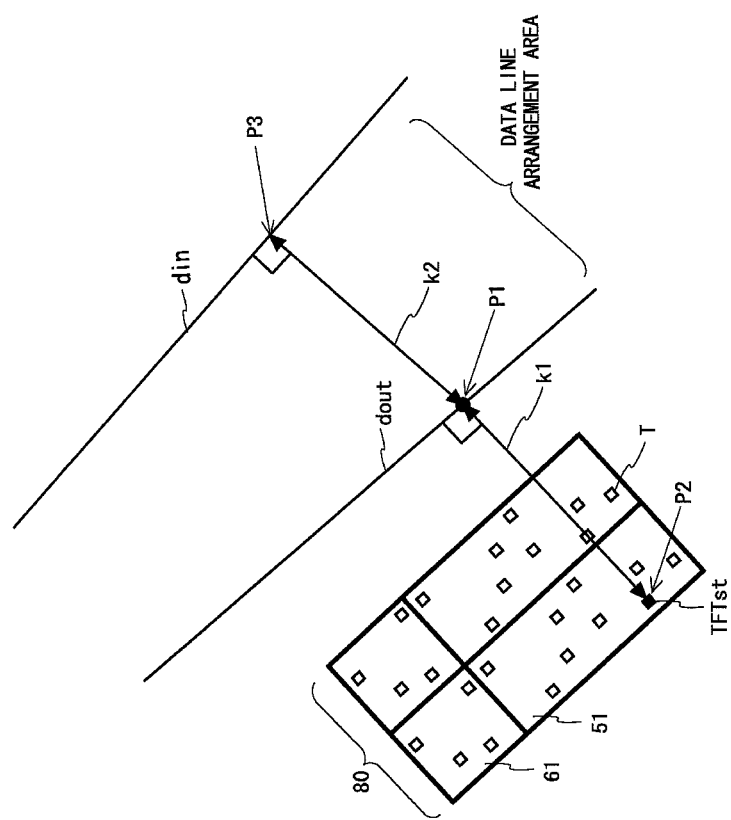
FIG. 15 is a diagram describing determination of the widths of the circuit area and the data line area of the display panel in the first embodiment.

FIG. 15 is a diagram describing determination of the widths of the circuit area and the data line area of the display panel 10 in the present embodiment. Calculation of the width of the circuit area will be described with reference to FIG. 15. Both the scan circuit 51 and the emission circuit 61 included in the unit circuit block 70 are formed in the frame area 11 as monolithic driver circuits and consist of dozens of TFTs, and therefore the location of each TFT can be visually identified.

Given that the data lines in the present embodiment are polylines each consisting of a plurality of straight line segments, point P1 is determined on a straight line segment of the outermost data line dout where the width of the circuit area is desired to be found, and then from point P1, straight line k1 is drawn into the circuit area so as to be perpendicular to the data line dout. The position of the farthest transistor TFTst on straight line k1 from point P1 is determined as point P2. Next, the distance between point P2 on the transistor TFTst and point P1 on the data line dout is obtained. The distance thus obtained is determined as the width of the circuit area.

Described next is determination of the width of the data line area. From point P1 obtained for determining the width of the circuit area, straight line k2 is drawn so as to be normal to the innermost data line din, and the intersection point is obtained as point P3. Then, based on straight line k2 drawn between points P1 and P3, the distance between point P1 on the data line dout and point P3 on the data line din is obtained. The distance thus obtained is determined as the width of the data line area.

Figure 16:
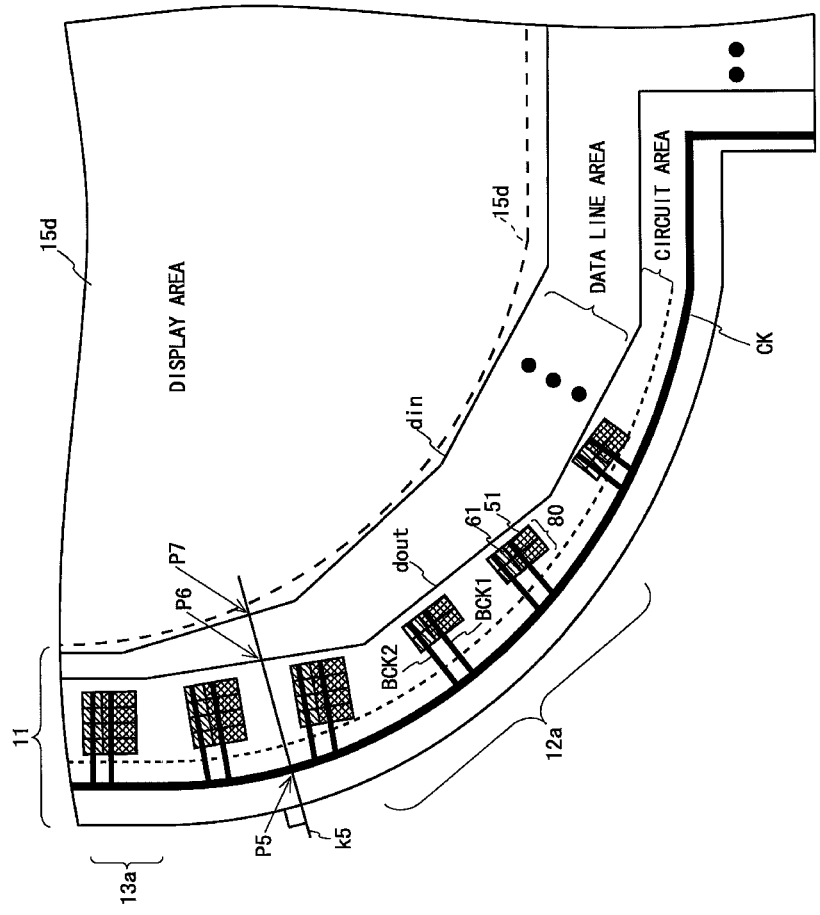
FIG. 16 is a diagram illustrating a clock signal line adapted to supply a clock signal to each parallel circuit block and formed in the first curvature portion outside the circuit area of the display panel in the first embodiment.
Figure 17:
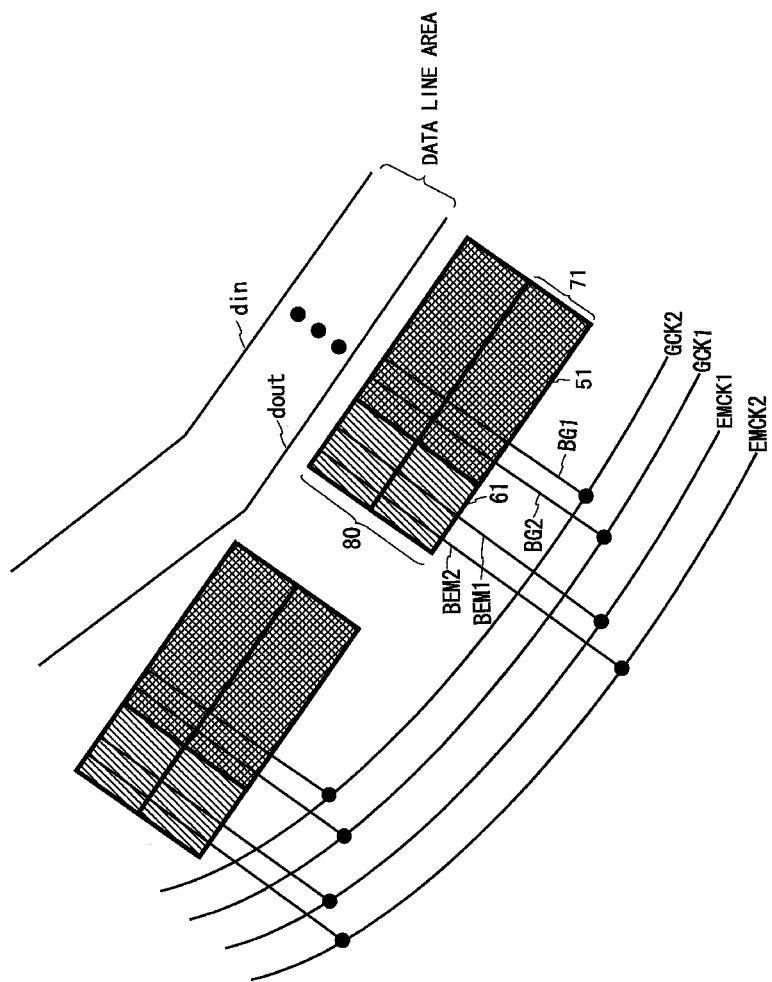
FIG. 17 is an enlarged view of the first curvature portion and a surrounding portion in FIG. 16.

In conjunction with this case, a method for identifying the unit circuit blocks 70 included in the parallel circuit blocks 80 arranged in the frame area 11 will be described. FIG. 16 is a diagram illustrating a clock signal line CK adapted to supply a clock signal to each parallel circuit block 80 and formed in the first curvature portion 12a outside the circuit area, and FIG. 17 is an enlarged view of the first curvature portion 12a in FIG. 16. The clock signal line CK shown in FIG. 16 consists of four signal lines, as shown in FIG. 17.

As shown in FIG. 17, two clock signal lines for supplying a clock signal to each scan circuit 51 included in the parallel circuit blocks 80 and two clock signal lines for supplying a clock signal to each emission circuit 61 are arranged along the circuit area in the frame area situated outside the circuit area. More specifically, as shown in FIG. 17, the two clock signal lines GCK1 and GCK2 for supplying a clock signal to each scan circuits 51, and the two clock signal lines EMCK1 and EMCK for supplying a clock signal to each emission circuit 61 are included in the clock signal line CK shown in FIG. 16.

As shown in FIG. 17, each of the four clock signal lines has four auxiliary signal lines extending therefrom, and of these lines, both the auxiliary signal lines BG1 and BG2, which supply clock signals GCK1 and GCK2, respectively, extend to and are connected to two scan circuits 51 included in the parallel circuit block 80. Similarly, both the auxiliary signal lines BEM1 and BEM2, which supply clock signals EMCK1 and EMCK2, respectively, extend to and are connected to two emission circuits 61 included in the parallel circuit block 80. Note that the auxiliary signal line will also be referred to as the "auxiliary clock signal line".

As a result, the clock signals EMCK1 and EMCK2 can be supplied simultaneously to all emission circuits 61 included in one parallel circuit block 80, and the clock signals GCK1 and GCK2 can also be supplied simultaneously to all scan circuits 51. In this manner, whether the parallel circuit block 80 functions as a single circuit block can be determined based on whether one or more scan circuits 51 and one or more emission circuits 61 share one auxiliary signal line branched from each clock signal line.

The definition of the distance between the clock signal line CK and the outermost line dout will be described with reference to FIG. 16. As shown in FIG. 16, normal line k5 is drawn from a point on the periphery of the frame area 11 to the display area 15 so as to be perpendicular to the periphery of the frame area 11. The positions at which normal line k5 thus drawn crosses the outermost line included in the clock signal line CK and the line dout are respectively obtained as points P5 and P6. Then, the distance between points P5 and P6 is measured, and the measured distance is determined as the distance between the clock signal line CK and the outermost line dout.

Described next is the definition of the distance between the outermost line dout and the innermost line din. The intersection point of normal line k5 and the line din located further inside is obtained as point P7. Then, the distance between points P6 and P7 is measured, and the measured distance is determined as the distance between the outer line dout and the innermost line din. Further, the distance between the clock signal line CK and the outermost line dout may be determined as the width of the circuit area, and the distance between the outer line dout and the innermost line din may be determined as the width of the data line area.

1.6 Effects

In the present embodiment, for the data line in the form of a polyline consisting of a plurality of short straight line segments in the first curvature portion 12a, as the distance from the terminal portion 16 increases, the slant angle of each straight line segment also increases, the number of data lines d decreases, and hence the width of the data line area decreases. Accordingly, the number of unit circuit blocks 70 in the parallel circuit block 80 disposed in the circuit area can be increased by widening the circuit area in proportion to the decrease in the width of the data line area. Therefore, even when the data line area for routing the data lines is provided in the first curvature portion 12a near the terminal portion 16, the first curvature portion 12a can be kept from becoming wide. Thus, the frame area 11 of the display panel 10 can be narrowed.

2. Second Embodiment

The configuration and operation of an organic EL display device according to a second embodiment is the same as the configuration and operation of the organic EL display device according to the first embodiment and therefore will not be elaborated upon in the present embodiment.

Figure 18:
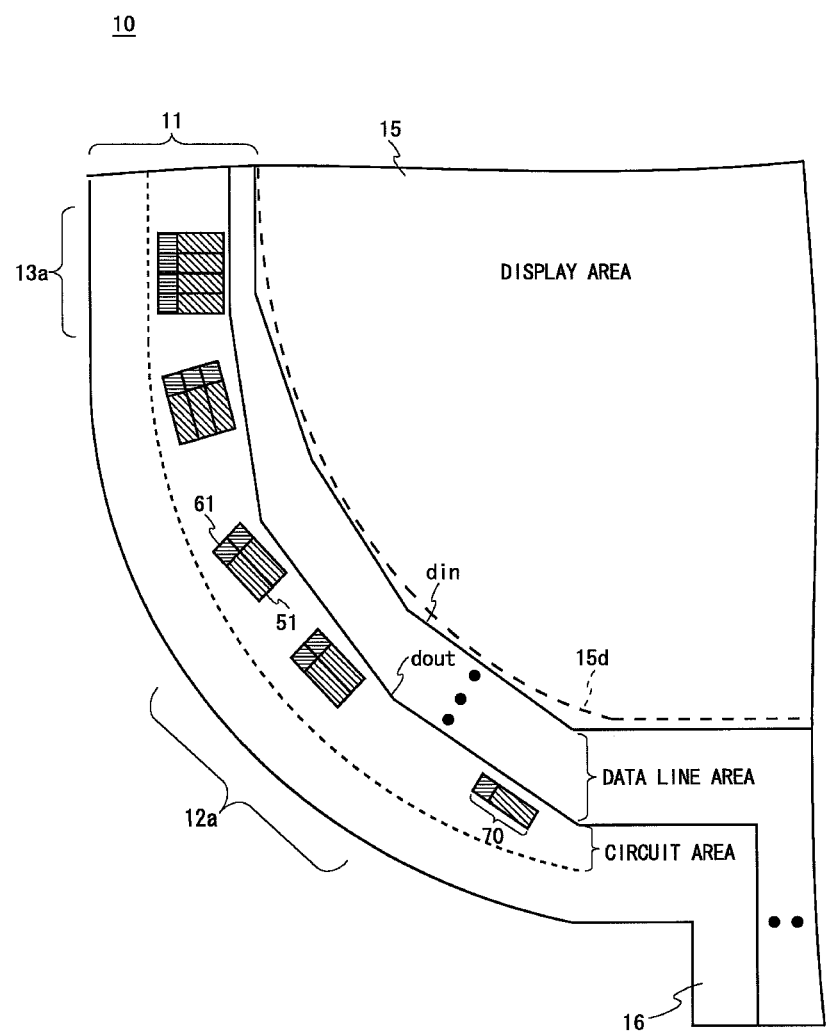
FIG. 18 is an enlarged view of a first curvature portion and a surrounding portion of a display panel in a second embodiment.

2.1 Arrangement of the Scan Circuit and the Emission Circuit in the Present Embodiment FIG. 18 is an enlarged view of the first curvature portion 12a and a surrounding portion of the display panel 10 in the present embodiment. As shown in FIG. 18, the data line area is the same as in the first embodiment shown in FIG. 14 and therefore will not be elaborated upon.

Next, the circuit area will be described. As shown in FIG. 18, there are a plurality of circuit blocks arranged along the data line dout provided outside the data line area. In the present embodiment, the slant angle of each circuit block is determined by the slant angle of the outermost data line dout adjacent to the circuit block, and the circuit block is disposed at one of three slant angles of 30, 45, and 60 degrees. Specifically, in the first curvature portion 12a, the slant angle of the data line is approximately 0 degrees, and therefore the circuit block is disposed at a slant angle of 30 degrees. In the farthest area from the terminal portion 16, the slant angle of the data line d is approximately 90 degrees, and therefore the circuit block is disposed at a slant angle of 60 degrees. In the intervening area, the slant angle of the data line has the intermediate value, and therefore the circuit block is disposed at a slant angle of 45 degrees.

In this case, the circuit area is narrow where the circuit area is adjacent to the wide data line area near the terminal portion 16, and the slant angle of the circuit block in the narrow circuit area is as small as 30 degrees, so that only a small number of unit circuit blocks 70 can be arranged. On the other hand, the circuit area is wide where the circuit area is adjacent to the narrow data line area away from the terminal portion 16, and the slant angle of the circuit block in the wide circuit area is as large as 60 degrees, so that a larger number of unit circuit blocks 70 can be arranged. Accordingly, even when the data line area is provided in the first curvature portion 12a near the terminal portion 16, most of the unit circuit blocks in the first curvature portion 12a can be arranged away from the terminal portion 16. Thus, the first curvature portion 12a can be kept from becoming wide, and therefore the frame area of the display panel 10 can be narrowed.

It should be noted that the unit circuit blocks 70 and the parallel circuit blocks 80 have been described above as being divided into three groups by slant angle: 30 degrees, 45 degrees, and 60 degrees, and arranged group by group sequentially from the first curvature portion 12a, which is closest to the terminal portion 16. However, the slant angles of these circuit blocks are not limited to the above and may be a different combination of three angles or a combination of two or four or more angles.

2.2 Effects

In the present embodiment, the slant angle of the circuit blocks that are situated away from the terminal portion 16 within the first curvature portion 12a is larger than in the case of the arrangement described in the first embodiment. Accordingly, the circuit blocks that are arranged in the circuit area away from the terminal portion 16 can include more unit circuit blocks 70. Therefore, even when the data line area is provided in the first curvature portion 12a near the terminal portion 16, the first curvature portion 12a can be kept from becoming wide, and therefore the frame area of the display panel 10 can be narrower than in the first embodiment.

3. Third Embodiment

The configuration and operation of an organic EL display device according to a third embodiment is the same as the configuration and operation of the organic EL display device according to the first embodiment and therefore will not be elaborated upon in the present embodiment.

Figure 19:
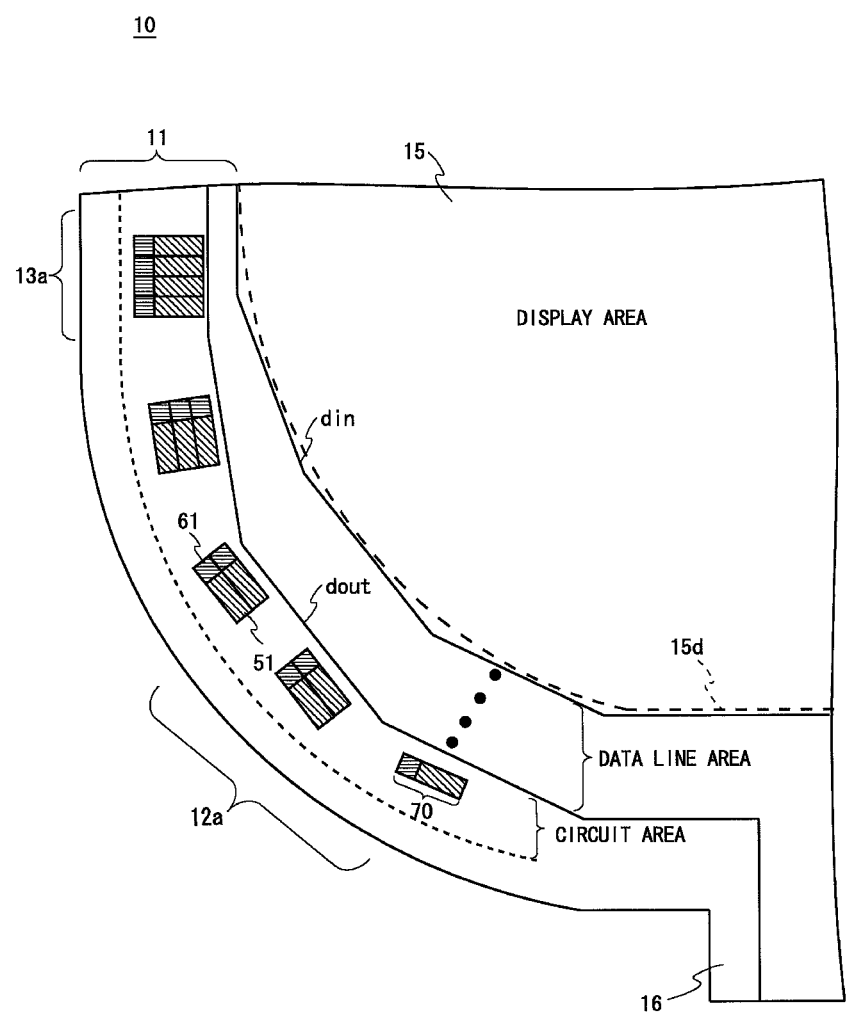
FIG. 19 is an enlarged view of a first curvature portion and a surrounding portion of a display panel in a third embodiment.

3.1 Arrangement of the Scan Circuit and the Emission Circuit in the Present Embodiment FIG. 19 is an enlarged view of the first curvature portion 12a and a surrounding portion of the display panel 10 in the present embodiment. As shown in FIG. 19, the data line area is the same as in the first embodiment and therefore will not be elaborated upon.

Next, the circuit area will be described. There are a plurality of circuit blocks arranged along the outermost data line dout. In the present embodiment, the slant angle of each circuit block is set to be approximately the same as the slant angle of a plurality of straight line segments that constitute the outermost data line dout. Accordingly, in the first curvature portion 12a, the slant angle of the data line is approximately 0 degrees, and therefore the circuit block is disposed at the same slant angle. The slant angle of the data line dout increases away from the terminal portion 16, and the slant angle of the circuit block increases correspondingly, with the result that in the farthest area, the slant angle of the circuit block reaches almost 90 degrees, and therefore the circuit block is disposed at a slant angle of approximately 90 degrees.

3.2 Effects

In the present embodiment, the slant angle of the circuit block is set more finely than in the case of the arrangement described in the second embodiment, and therefore the slant angle of the circuit block increases away from the terminal portion 16, more than in the second embodiment. Accordingly, the circuit area is further widened, and the circuit blocks that are arranged in the frame area away from the terminal portion 16 can include more unit circuit blocks 70. Therefore, even when the data line area is provided in the first curvature portion 12a near the terminal portion 16, the first curvature portion 12a can be kept from becoming wide, and therefore the frame area of the display panel 10 can be much narrower than in the first embodiment.

4. Variants Common Among the Embodiments

Described below are first through third variants that can be applied in common to the display panels of the display devices according to the first through third embodiments.

4.1 First Variant

Figure 20A:
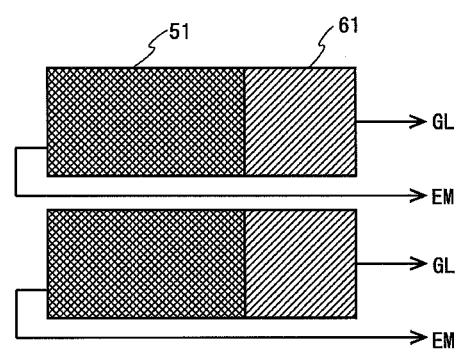
FIG. 20 provides block diagrams illustrating the arrangement of scan circuits and emission circuits provided in a frame area of a display panel in a display device according to a first variant of the first through third embodiments; more specifically, FIG. 20 (*a*) is a diagram where one scan circuit is disposed for one emission circuit, FIG. 20(*b*) is a diagram where two scan circuits are disposed for one emission circuit, and FIG. 20(*c*) is a diagram where three scan circuits are disposed for one emission circuit.
Figure 20B:
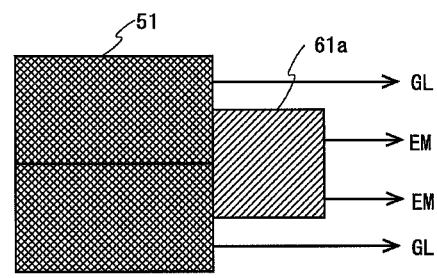
Figure 20C:
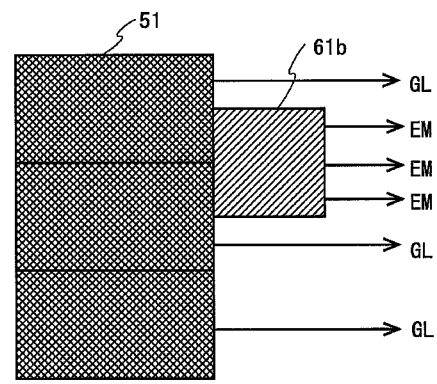

FIG. 20 provides block diagrams illustrating the arrangement of scan circuits 51 and emission circuits 61 provided in the frame area 11 of the display panel 10 in the display device according to the first variant of the first through third embodiments; more specifically, FIG. 20(a) is a diagram where one scan circuit 51 is disposed for one emission circuit 61, FIG. 20(b) is a diagram where two scan circuits 51 are disposed for one emission circuit 61a, and FIG. 20(c) is a diagram where three scan circuits 51 are disposed for one emission circuit 61b.

The configuration shown in FIG. 20(a) in which one scan circuit 51 is disposed for one emission circuit 61 is the same as the configuration in the embodiments. However, in FIG. 20(a), the scan circuit 51 is positioned outside with respect to the emission circuit 61 positioned near the data line area, for convenience of description in FIGS. 20(b) and 20(c) to be described later. As can be appreciated from the timing chart shown in FIG. 8, two adjacent emission circuits 61 simultaneously output emission control signals. On the other hand, two scan circuits 51 corresponding to two emission circuits 61 output scanning signals at different times from each other.

In this case, even when the emission circuit 61 outputs an emission control signal simultaneously to two emission control lines, there is little influence on a display image. Accordingly, as shown in FIG. 20(b), the two emission circuits 61 that simultaneously output the same emission control signal may be replaced by one emission circuit 61a to which two emission control lines are provided. In this case, the emission circuit 61a outputs an emission control signal simultaneously to the two emission control lines. Moreover, the two scan circuits 51 have respective lines extending therefrom and arranged with the emission circuit 61a positioned therebetween. Accordingly, there is no need to provide a gap in which to dispose an emission control line between the two scan circuits 51 adjacent to each other, and therefore the area that is required for arranging the scan circuits 51 can be narrowed, thereby narrowing the frame area of the display panel 10. Note that the emission circuit 61a does not have to be centered with respect to the two scan circuits 51 and may be disposed so as to deviate to either of the two scan circuits 51. In such a case, both of the lines respectively extending from the two scan circuits 51 are arranged on one side of the emission circuit 61a.

Similarly, as shown in FIG. 20(c), three emission circuits 61 that output the same emission control signal may be replaced by one emission circuit 61b provided with three emission control lines. In this case, as in the case shown in FIG. 20(b), three scan circuits 51 have respective lines extending therefrom and arranged with the emission circuit 61 positioned therebetween. As a result, the frame area of the display panel 10 can be narrowed. Note that as in the case shown in FIG. 20(b), the emission circuit 61b does not have to be centered with respect to the three scan circuits 51 and may be disposed so as to deviate to one of the three scan circuits 51. In such a case, all of the lines respectively extending from the three scan circuits 51 are arranged on one side of the emission circuit 61b.

4.2 Second Variant

Figure 21:
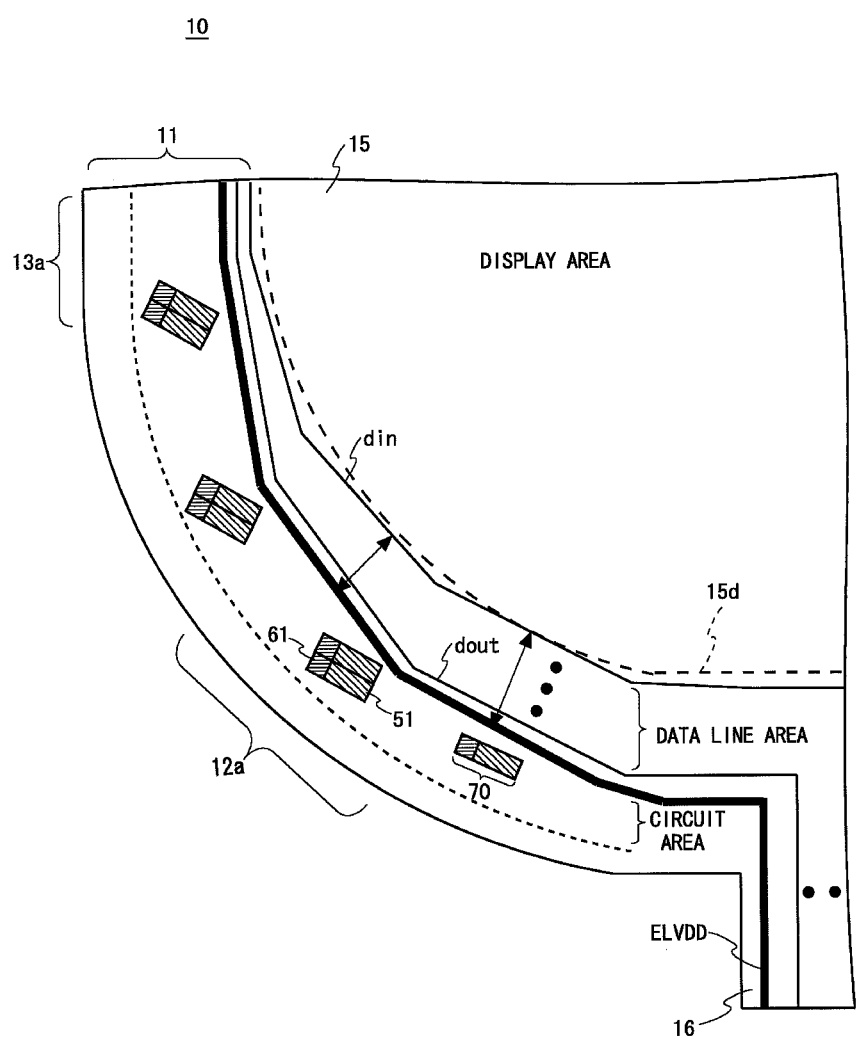
FIG. 21 is an enlarged view of a first curvature portion and a surrounding portion of a display panel in a display device according to a second variant of the first through third embodiments.

FIG. 21 is an enlarged view of the first curvature portion and a surrounding portion of the display panel 10 in the display device according to the second variant of the first through third embodiments. In FIG. 21, unlike in FIG. 14, there is a drive voltage line ELVDD provided between the data line area and the circuit area. The drive voltage line ELVDD extends along the farthest data line dout from the terminal portion 16, and supplies a drive voltage ELVDD to each of the scan circuits 51 and the emission circuits 61 in the circuit blocks from the vicinity of the scan circuits 51 and the emission circuits 61 through auxiliary power lines respectively extending to the scan circuits 51 and the emission circuits 61. To determine the width of a wiring area, which is a combined area made up of the data line area and a power line area in which the drive voltage line ELVDD as above is formed, the intersection point of the drive voltage line ELVDD and the data line dout is obtained by drawing a straight line from a point on the drive voltage line ELVDD perpendicular to the outermost data line dout, in a manner similar to that of drawing the line for determining the width of the data line area. Then, the distance between the point on the drive voltage line ELVDD and the intersection point with the outermost data line dout is determined and set as the width of the wiring area. In this manner, when the data line area and the power line area are provided between the display area 15 and the circuit area, not only the width of the data line area but also the width of the power line area needs to be taken into consideration. Therefore, the sum of the widths of these areas is obtained, and then the arrangement of the unit circuit blocks 70 and the parallel circuit blocks 80 is determined. Note that in place of the drive voltage line ELVDD, a drive voltage line ELVSS or another type of line may be disposed between the data line area and the circuit area.

4.3 Third Variant

Figure 22:
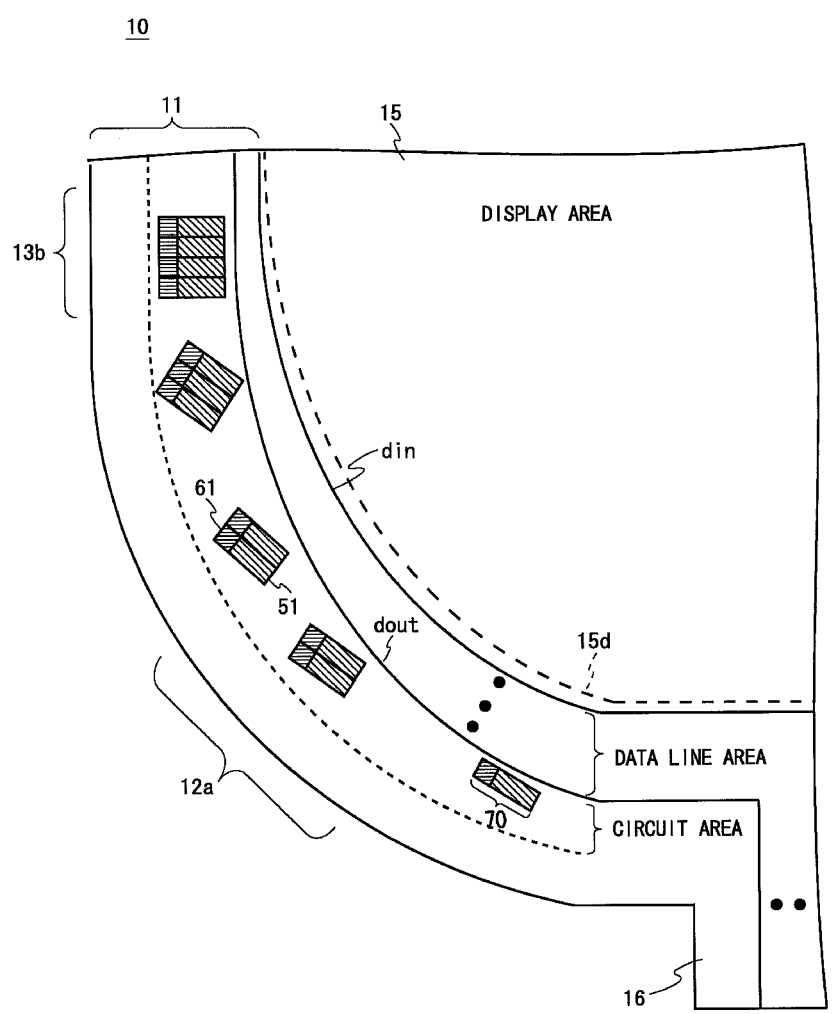
FIG. 22 is an enlarged view of the first curvature portion and a surrounding portion of the display device in the first embodiment where the data line is in the form of a smooth curve.

In the first embodiment, the data line has been described as being in the form of a polyline consisting of a plurality of straight line segments. However, the data line may be in the form of a smooth curve. FIG. 22 is an enlarged view of the first curvature portion 12a and a surrounding portion of the display device in the first embodiment where the data line is in the form of a smooth curve. Each data line arranged in the first curvature portion 12a is a smooth curve. Slant angles of the curve are represented by slant angles of tangent lines at points on the curve, and the data line is disposed such that the slant angle thereof increases away from the terminal portion. In the first embodiment, since the data line is in the form of a polyline consisting of a plurality of straight line segments, the point at which the width of the circuit area is desired to be found, is identified on the straight line segment included in the outermost data line dout. However, in the present variant, the width of the data line area and the width of the circuit area are determined with respect to a point of tangency of a tangent line drawn to the outermost data line dout. Note that the procedure of determining the widths of the circuit area and the data line area is the same as that described in the first embodiment and therefore will not be elaborated upon.

5. Other Shapes of the Display Panel and the Display Area

In the embodiments, the frame area 11 and the display area 15 have been described as having curved corners. However, the present invention can be applied even when the display panel 10 and the display area 15 are in shapes to be described below. FIGS. 23 and 24 provide diagrams illustrating examples of the shapes of the display panel and the display area to which the arrangement of the circuit blocks described in the first through third embodiments can be applied. For example, as shown in FIGS. 23 and 24, the outer shape of the display panel 10 may simply consist of curves or may be a polygon consisting of slanted straight line segments. Similarly, the shape of the outer edge 15a of the display area 15 may simply consist of curves or may be a polygon consisting of slanted straight line segments. Note that the corner portions of the display areas 15 of the display panels 10 shown in FIGS. 24(a) and 24(b) consist of slanted straight line segments and therefore will be referred to as the slanted line segment areas.

For example, both the display panel 10 and the display area 15 may be elliptical, as shown in FIG. 23(a), or may be regular octagonal and circular, respectively, as shown in FIG. 23(b). Alternatively, both the display panel 10 and the display area 15 may be elongated octagonal, as shown in FIG. 24(a), or regular octagonal, as shown in FIG. 24 (b).

In any case, the unit circuit blocks 70 or the parallel circuit blocks 80, each consisting of a plurality of unit circuit blocks 70 arranged in parallel, are disposed in a slanted manner along the data line area provided in the first or fourth curvature portion 12a or 12d near the terminal portion 16 of the display panel. Accordingly, the frame area 11 can be narrowed as a result of being kept from becoming wide in the data line area of the first or fourth curvature portion 12a or 12d. Note that these variants are merely illustrative examples and can also be applied to other irregularly shaped display panels.

6. Appendixes

In Appendix 1, a display device includes a display panel provided with a display area, a frame area provided around the display area, and a terminal portion, the display area having arranged therein a plurality of scanning lines, a plurality of emission control lines extending parallel to the scanning lines, a plurality of data lines extending so as to cross the scanning lines and the emission control lines, and a plurality of pixel circuits provided near respective intersections of the scanning lines and the data lines, the frame area having disposed therein a circuit block including at least one of a plurality of scan circuits configured to respectively output scanning signals to the scanning lines and at least one of a plurality of emission circuits configured to respectively output emission control signals to the emission control lines, the terminal portion being provided with lines for externally supplying data signals to the data lines, wherein the display panel has a curved area or a slanted area included at least in a curvature portion near the terminal portion, the curvature portion has formed therein a data line area and a circuit area, the data line area having some of the data lines arranged so as to extend from the terminal portion along an outer edge of the display area, the circuit area having at least one of the circuit blocks disposed outside the data line area, the data line area decreases in width away from the terminal portion, and the circuit area increases in width away from the terminal portion.

In Appendix 2 based on the display device in Appendix 1, the circuit block is a rectangular unit circuit block including one of the scan circuits and one of the emission circuits disposed in series, or a parallel circuit block including a plurality of the unit circuit blocks disposed in parallel, and the circuit block is disposed in the circuit area, with a longitudinal axis thereof slanted at a predetermined slant angle from the scanning line.

In the display device of Appendix 2, the circuit block is disposed with the longitudinal axis slanted at the predetermined slant angle, with the result that more unit circuit blocks can be arranged in the circuit block while keeping the circuit area from becoming wide in the curvature portion near the terminal portion.

In Appendix 3 based on the display device in Appendix 2, the predetermined slant angle is constant among all of the circuit blocks.

In the display device of Appendix 3, the circuit blocks are arranged at a constant slant angle, thereby facilitating the arrangement of the circuit blocks in the circuit area.

In Appendix 4 based on the display device in Appendix 3, the constant angle is about 45 degrees.

In the display device of Appendix 4, the slant of the data lines arranged in the curvature portion near the terminal portion sequentially changes from an angle close to 0 degrees to an angle close to 90 degrees as the distance from the terminal portion increases. Accordingly, by setting the slant angle of the circuit blocks to about 45 degrees, which is an approximate average angle among the circuit blocks, it is rendered possible to facilitate the arrangement of the circuit blocks while to some extent keeping the circuit area from becoming wide.

In Appendix 5 based on the display device in Appendix 2, the display device according to claim 2, wherein the predetermined slant angle is selected from a predetermined number of slant angles, and the circuit blocks are sequentially arranged from an end of the circuit area that is near the terminal portion, at slant angles selected in ascending order from among the predetermined number of slant angles.

In the display device of Appendix 5, the circuit blocks that are arranged in the circuit area away from the terminal portion can include more unit circuit blocks. Therefore, in a portion of the display panel near the terminal portion where the data line area becomes wider, the circuit area can be narrowed, so that the frame area of the display panel can be narrowed.

In Appendix 6 based on the display device in Appendix 2, the circuit blocks are disposed in the circuit area along an outermost data line disposed in the data line area, at the same angle as the slant angle of a closest data line to the circuit block.

In the display device of Appendix 6, the slant angle of the circuit block can be set more finely, and therefore the slant angle of the circuit block increases to a greater extent as the distance from the terminal portion increases. Accordingly, as the distance from the terminal portion increases, the circuit area is widened to a greater extent, with the result that the circuit blocks that are arranged in the frame area away from the terminal portion can include more unit circuit blocks. Therefore, even when the data line area is provided with a greater width in a portion near the terminal portion, the sum of the widths of the circuit area and the data line area can be kept from increasing, and therefore the frame area of the display panel can be further narrowed.

In Appendix 7 based on the display device in Appendix 6, when the data line is in the form of a polyline consisting of a plurality of straight line segments, the data line has the same slant angle as a closest straight line segment to the circuit block in which the data line is disposed.

In the display device of Appendix 7, the data line has the same slant angle as a closest straight line segment to the circuit block in which the data line is disposed, and therefore the same effects as those achieved by the display device of Appendix 6 can be achieved.

In Appendix 8 based on the display device in Appendix 6, when the data line is in the form of a curve, the data line has the same slant angle as a tangent to the curve at a closest point to the circuit block in which the data line is disposed.

In the display device of Appendix 8, the data line has the same slant angle as a tangent to the curve at a closest point to the circuit block in which the data line is disposed, and therefore the same effects as those achieved by the display device of Appendix 6 can be achieved.

In Appendix 9 based on the display device in Appendix 2, the further parallel circuit block disposed in the circuit area away from the terminal portion includes more of the unit circuit blocks.

In the display device of Appendix 9, as the distance from the terminal portion increases, the number of data lines arranged decreases, with the result that the width of the data line area decreases, and the slant angle of the data line increases. Thus, the number of unit circuits in the parallel circuit block disposed in the circuit area increases as the distance from the terminal portion increases.

In Appendix 10 based on the display device in Appendix 2, the display panel further includes a first side portion being a straight line area adjacent to the curvature portion and parallel to the data line, and in the first side portion, the circuit block is disposed with the longitudinal axis oriented parallel to the scanning line.

In the display device of Appendix 10, the data line is not disposed in the straight line area, and therefore the data line area does not need to be taken into consideration. Accordingly, the circuit blocks can be arranged efficiently by orienting the respective longitudinal axes parallel to the first signal line.

In Appendix 11 based on the display device in Appendix 1, the display device further includes a power line area having disposed therein a drive voltage line for supplying a drive voltage to the scan circuit and the emission circuit disposed in the circuit area, and the drive voltage line is disposed between the data line area and the circuit area.

In the display device of Appendix 11, the power line area having disposed therein the drive voltage line for supplying the drive voltage to the scan circuit and the emission circuit is disposed between the data line area and the circuit area. Therefore, to determine the width of the circuit area, not only the width of the data line area but also the width of the power line area needs to be taken into consideration.

In Appendix 12 based on the display device in Appendix 11, the display device includes a plurality of clock signal lines providing clock signals to the scan circuit and the emission circuit and disposed in the frame area outside the circuit area, and for each of the circuit blocks, the clock signals are supplied to the scan circuit and the emission circuit through a plurality of auxiliary clock signal lines extending from each of the clock signal lines to the circuit block.

In the display device of Appendix 12, whether the circuit block functions as one circuit block can be determined based on whether one or more scan circuits and one or more emission circuits share one auxiliary signal line branched from each clock signal line.

In Appendix 13 based on the display device in Appendix 1, the emission circuit outputs the same emission control signal simultaneously to each of the emission control lines, more than one scan circuit is provided for each emission circuit, the emission circuit is narrower than a combined width of the more than one scan circuit, and the scanning lines are arranged so as to extend from the respective scan circuits to the display area and have the emission circuit positioned therebetween.

In the display device of Appendix 13, the number of emission circuits to be formed in the circuit area is decreased. As a result, the circuit area can be narrowed in proportion to the decrease in the number of emission circuits, so that the frame area of the display panel can be narrowed.

In Appendix 14 based on the display device in Appendix 13, the emission circuit is disposed in the circuit area so as to be closer to the display area than are the scan circuits in the circuit area.

The display device of Appendix 14 dispenses with the need to provide a gap between two adjacent scan circuits for the purpose of arranging an emission control line to be connected to the emission circuit. Thus, the area that is required for arranging the scan circuits can be narrowed, so that the frame area of the display panel can be narrowed.

DESCRIPTION OF THE REFERENCE CHARACTERS 10 display panel
11 frame area
12a first curvature portion
15 display area
15d outer edge (of display area)
16 terminal portion
51 scan circuit 61 emission circuit
70 unit circuit block
80 parallel circuit block

The invention claimed is:

1. A display device comprising a display panel provided with a display area, the frame area provided around the display area, and a terminal portion, the display area having arranged therein a plurality of scanning lines, a plurality of emission control lines extending parallel to the scanning lines, a plurality of data lines extending so as to cross the scanning lines and the emission control lines, and a plurality of pixel circuits provided near respective intersections of the scanning lines and the data lines, the frame area having disposed therein a circuit block including at least one from each of the following: a plurality of scan circuits configured to respectively output scanning signals to the scanning lines; and a plurality of emission circuits configured to respectively output emission control signals to the emission control lines, the terminal portion being provided with lines for externally supplying data signals to the data lines, wherein,
the display panel has a curved area or a slanted area included at least in a curvature portion near the terminal portion,
the curvature portion has formed therein a data line area and a circuit area, the data line area having some of the data lines arranged so as to extend from the terminal portion along an outer edge of the display area, the circuit area having at least one of the circuit blocks disposed outside the data line area,
the data line area decreases in width away from the terminal portion, and
the circuit area increases in width away from the terminal portion.

2. The display device according to claim 1, wherein the circuit block is a rectangular unit circuit block including one of the scan circuits and one of the emission circuits disposed in series, or a parallel circuit block including a plurality of the unit circuit blocks disposed in parallel, and the circuit block is disposed in the circuit area, with a longitudinal axis thereof slanted at a predetermined slant angle from the scanning line.

3. The display device according to claim 2, wherein the predetermined slant angle is constant among all of the circuit blocks.

4. The display device according to claim 3, wherein the constant angle is about 45 degrees.

5. The display device according to claim 2, wherein the predetermined slant angle is selected from a predetermined number of slant angles, and the circuit blocks are sequentially arranged from an end of the circuit area that is near the terminal portion, at slant angles selected in ascending order from among the predetermined number of slant angles.

6. The display device according to claim 2, wherein the circuit blocks are disposed in the circuit area along an outermost data line disposed in the data line area, at the same angle as the slant angle of a closest data line to the circuit block.

7. The display device according to claim 6, wherein, when the data line is in the form of a polyline consisting of a plurality of straight line segments, the data line has the same slant angle as a closest straight line segment to the circuit block in which the data line is disposed.

8. The display device according to claim 6, wherein, when the data line is in the form of a curve, the data line has the same slant angle as a tangent to the curve at a closest point to the circuit block in which the data line is disposed.

9. The display device according to claim 2, wherein the further parallel circuit block disposed in the circuit area away from the terminal portion includes more of the unit circuit blocks.

10. The display device according to claim 2, wherein the display panel further includes a first side portion being a straight line area adjacent to the curvature portion and parallel to the data line, and in the first side portion, the circuit block is disposed with the longitudinal axis oriented parallel to the scanning line.

11. The display device according to claim 10, further comprising a power line area having disposed therein a drive voltage line for supplying a drive voltage to the scan circuit and the emission circuit disposed in the circuit area, the drive voltage line being disposed between the data line area and the circuit area.

12. The display device according to claim 11, comprising a plurality of clock signal lines providing clock signals to the scan circuit and the emission circuit and disposed in the frame area outside the circuit area, wherein for each of the circuit blocks, the clock signals are supplied to the scan circuit and the emission circuit through a plurality of auxiliary clock signal lines extending from each of the clock signal lines to the circuit block.

13. The display device according to claim 1, wherein, the emission circuit outputs the same emission control signal simultaneously to each of the emission control lines, more than one scan circuit is provided for each emission circuit, the emission circuit is narrower than a combined width of the more than one scan circuit, and the scanning lines are arranged so as to extend from the respective scan circuits to the display area and have the emission circuit positioned therebetween.

14. The display device according to claim 13, wherein the emission circuit is disposed in the circuit area so as to be closer to the display area than are the scan circuits in the circuit area.

* * * * *